US011728388B2

(12) United States Patent
Cho et al.

(10) Patent No.: US 11,728,388 B2
(45) Date of Patent: Aug. 15, 2023

(54) METHOD FOR MANUFACTURING A SEMICONDUCTOR DEVICE

(71) Applicant: SAMSUNG ELECTRONICS CO., LTD., Suwon-si (KR)

(72) Inventors: Keunhwi Cho, Seoul (KR);
Byounghak Hong, Seoul (KR);
Myunggil Kang, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/694,994

(22) Filed: Mar. 15, 2022

(65) Prior Publication Data

US 2022/0208970 A1   Jun. 30, 2022

Related U.S. Application Data

(63) Continuation of application No. 15/931,964, filed on May 14, 2020, now Pat. No. 11,282,928.

(30) Foreign Application Priority Data

Nov. 5, 2019   (KR) .................. 10-2019-0140410

(51) Int. Cl.
*H01L 29/161* (2006.01)
*H01L 29/10* (2006.01)
*H01L 29/78* (2006.01)

(52) U.S. Cl.
CPC ........ *H01L 29/161* (2013.01); *H01L 29/1041* (2013.01); *H01L 29/7848* (2013.01)

(58) Field of Classification Search
CPC ............... H01L 29/161; H01L 29/1041; H01L 29/7848
USPC .......................................................... 257/76
See application file for complete search history.

(56) References Cited

U.S. PATENT DOCUMENTS

| | | | |
|---|---|---|---|
| 6,900,143 B1 | 5/2005 | Pan et al. | |
| 7,402,483 B2 | 7/2008 | Yun et al. | |
| 9,773,875 B1 * | 9/2017 | Jagannathan | ......... H01L 29/165 |
| 9,899,519 B2 | 2/2018 | Wang et al. | |
| 10,103,250 B2 | 10/2018 | Lu et al. | |
| 10,153,344 B2 | 12/2018 | Tsai et al. | |
| 10,243,054 B1 | 3/2019 | Cheng et al. | |
| 10,263,100 B1 | 4/2019 | Bi et al. | |
| 10,297,508 B2 | 5/2019 | Cheng et al. | |
| 2017/0104061 A1 | 4/2017 | Peng et al. | |
| 2018/0166533 A1 | 6/2018 | Colinge et al. | |
| 2019/0131394 A1 | 5/2019 | Reznicek et al. | |
| 2019/0131395 A1 | 5/2019 | Lee et al. | |
| 2019/0131415 A1 | 5/2019 | Cheng et al. | |

(Continued)

*Primary Examiner* — Igwe U Anya
(74) *Attorney, Agent, or Firm* — Lee IP Law, P.C.

(57) ABSTRACT

A semiconductor device including an active structure on a substrate, the active structure including silicon germanium patterns and silicon patterns alternately and repeatedly stacked in a vertical direction perpendicular to an upper surface of the substrate; a semiconductor layer on sidewalls of the active structure that face in a first direction parallel to the upper surface of the substrate, the semiconductor layer being a source/drain region; and a gate structure on a surface of the active structure and the substrate, the gate structure extending in a second direction that is perpendicular to the first direction, wherein the silicon germanium patterns are silicon rich-silicon germanium.

20 Claims, 31 Drawing Sheets

(56) References Cited

U.S. PATENT DOCUMENTS

2019/0148515 A1 5/2019 Cheng et al.
2019/0214502 A1 7/2019 Xu et al.
2020/0058653 A1 2/2020 Chiang et al.

* cited by examiner

US 11,728,388 B2

METHOD FOR MANUFACTURING A SEMICONDUCTOR DEVICE

CROSS-REFERENCE TO RELATED APPLICATIONS

This is a continuation application based on pending application Ser. No. 15/931,964, filed May 14, 2020, the entire contents of which is hereby incorporated by reference.

Korean Patent Application No. 10-2019-0140410, filed on Nov. 5, 2019, in the Korean Intellectual Property Office, and entitled: "Semiconductor Devices," is incorporated by reference herein in its entirety.

BACKGROUND

1. Field

Embodiments relate to semiconductor devices.

2. Description of the Related Art

In a semiconductor device, a fin field effect transistor may be formed on an active fin structure in which different semiconductor materials are alternately stacked.

SUMMARY

The embodiments may be realized by providing a semiconductor device including an active structure on a substrate, the active structure including silicon germanium patterns and silicon patterns alternately and repeatedly stacked in a vertical direction perpendicular to an upper surface of the substrate; a semiconductor layer on sidewalls of the active structure that face in a first direction parallel to the upper surface of the substrate, the semiconductor layer being a source/drain region; and a gate structure on a surface of the active structure and the substrate, the gate structure extending in a second direction that is perpendicular to the first direction, wherein the silicon germanium patterns are silicon rich-silicon germanium.

The embodiments may be realized by providing a semiconductor device including an active structure on a substrate, the active structure including silicon germanium patterns and silicon patterns alternately and repeatedly stacked in a vertical direction perpendicular to an upper surface of the substrate; a gate structure on an upper surface of the active structure and on both sidewalls of the active structure that face in a second direction parallel to the upper surface of the substrate, the gate structure extending in the second direction; and a silicon layer on both sidewalls of the active structure that face in a first direction perpendicular to the second direction and at both sides in the first direction of the gate structure, the silicon layer being a source/drain region; wherein a concentration of silicon in the silicon germanium patterns is about 70% to about 85%.

The embodiments may be realized by providing a semiconductor device including a first active structure on a first region of a substrate, the first active structure including silicon patterns spaced apart from each other in a vertical direction perpendicular to a surface of the substrate; a first gate structure on the substrate and the first active structure and filling a gap between the silicon patterns of the first active structure in the vertical direction; a second active structure on a second region of the substrate, the second active structure including silicon germanium patterns and silicon patterns alternately and repeatedly stacked in the vertical direction; and a second gate structure on a surface of the second active structure and the substrate, wherein the silicon germanium patterns in the second active structure are silicon rich-silicon germanium.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, two directions substantially parallel to an upper surface of a substrate and crossing each other may be referred to as first and second directions, respectively, and a direction substantially perpendicular to the upper surface of the substrate may be referred to as a vertical direction. In example embodiments, the first and second directions may be substantially perpendicular to each other.

Figure 3:
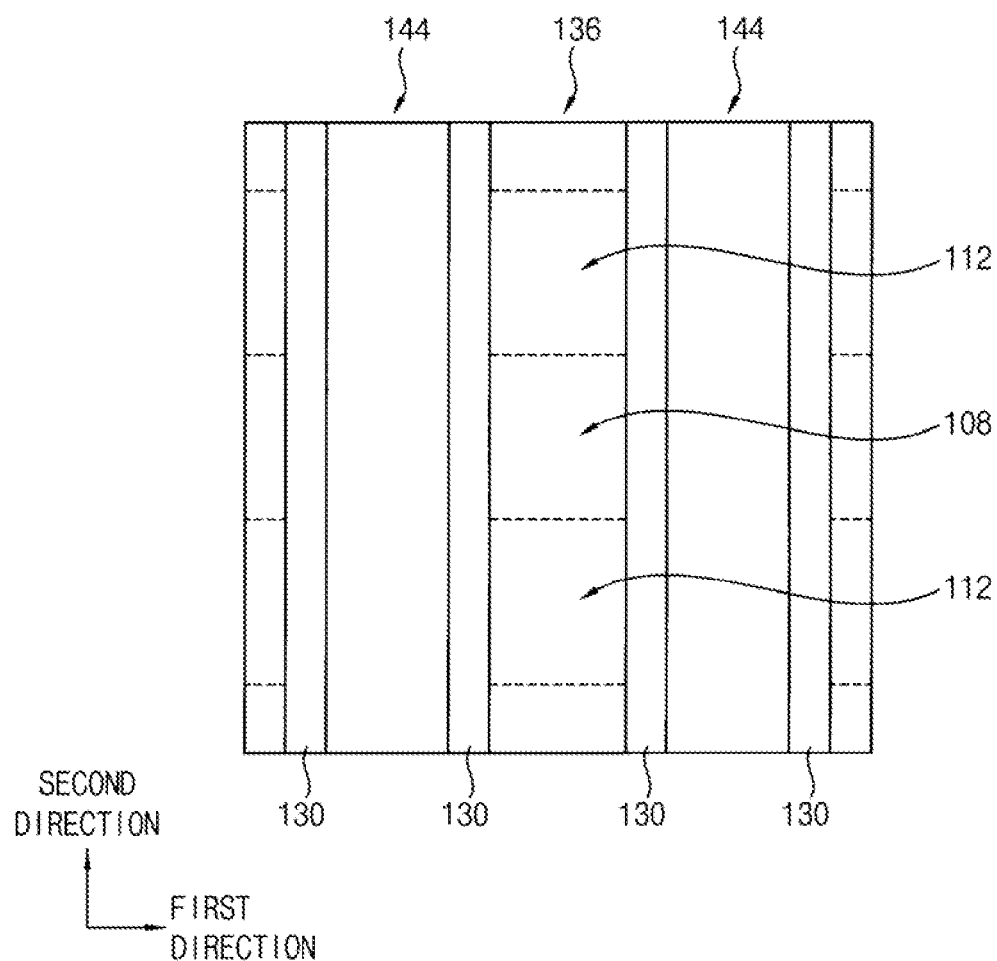
Figure 4:
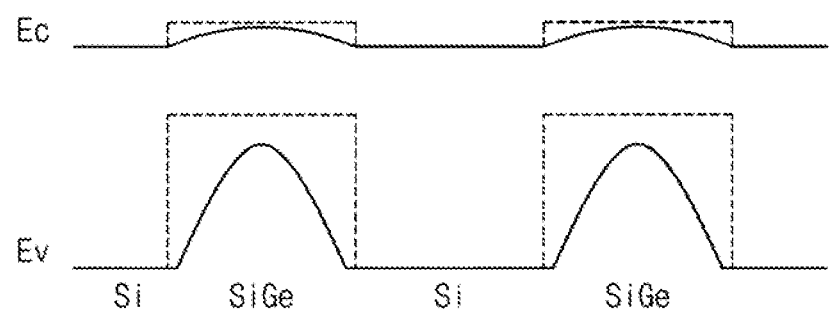
FIG. 4 is an energy band of a first semiconductor pattern and a second semiconductor pattern.

FIGS. 1A, 1B, 2 and 3 are cross-sectional views, a perspective view, and a plan view of a semiconductor device in accordance with example embodiments. FIG. 4 is an energy band of a first semiconductor pattern and a second semiconductor pattern. FIGS. 5 to 8 are perspective views of concentrations of silicon in first semiconductor patterns in each of active structures.

Figure 1A:
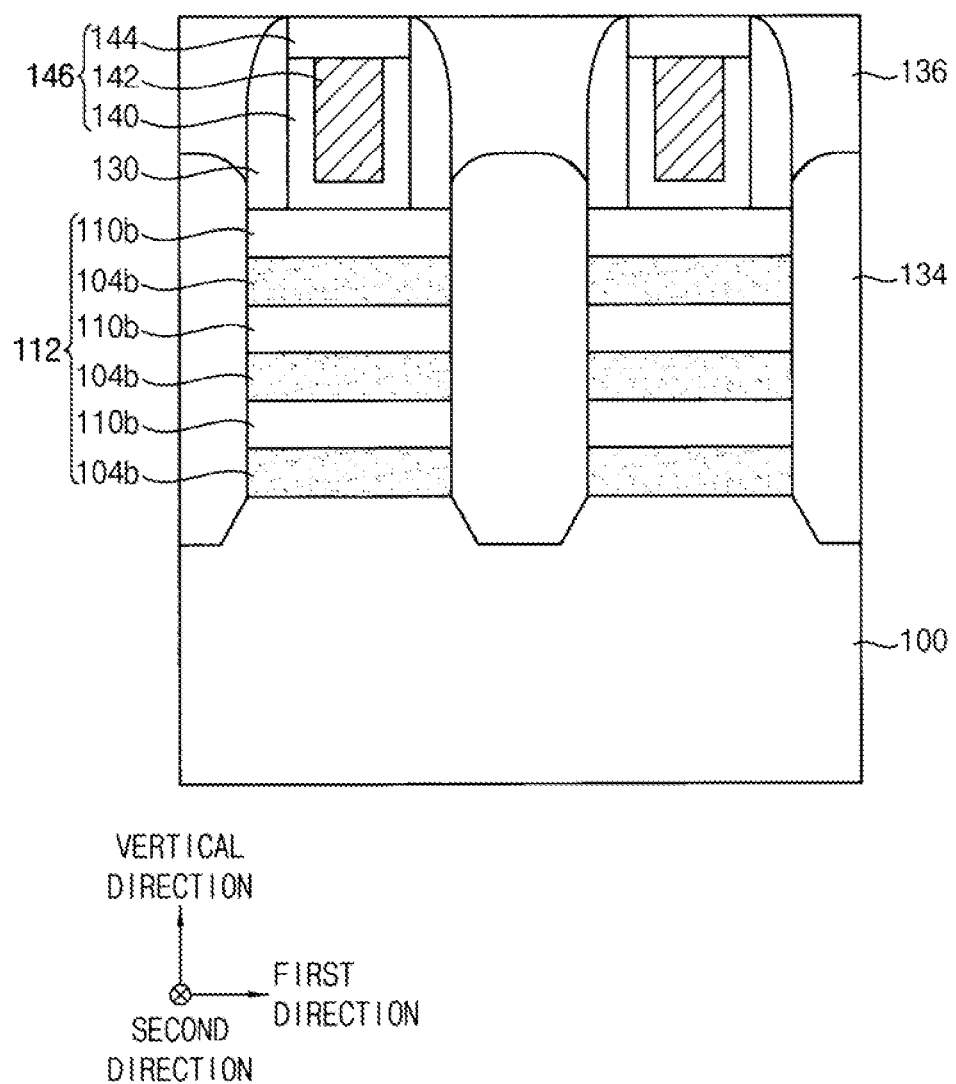
FIGS. 1A, 1B, 2, and 3 illustrate cross-sectional views, a perspective view and a plan view of a semiconductor device in accordance with example embodiments.
Figure 1B:
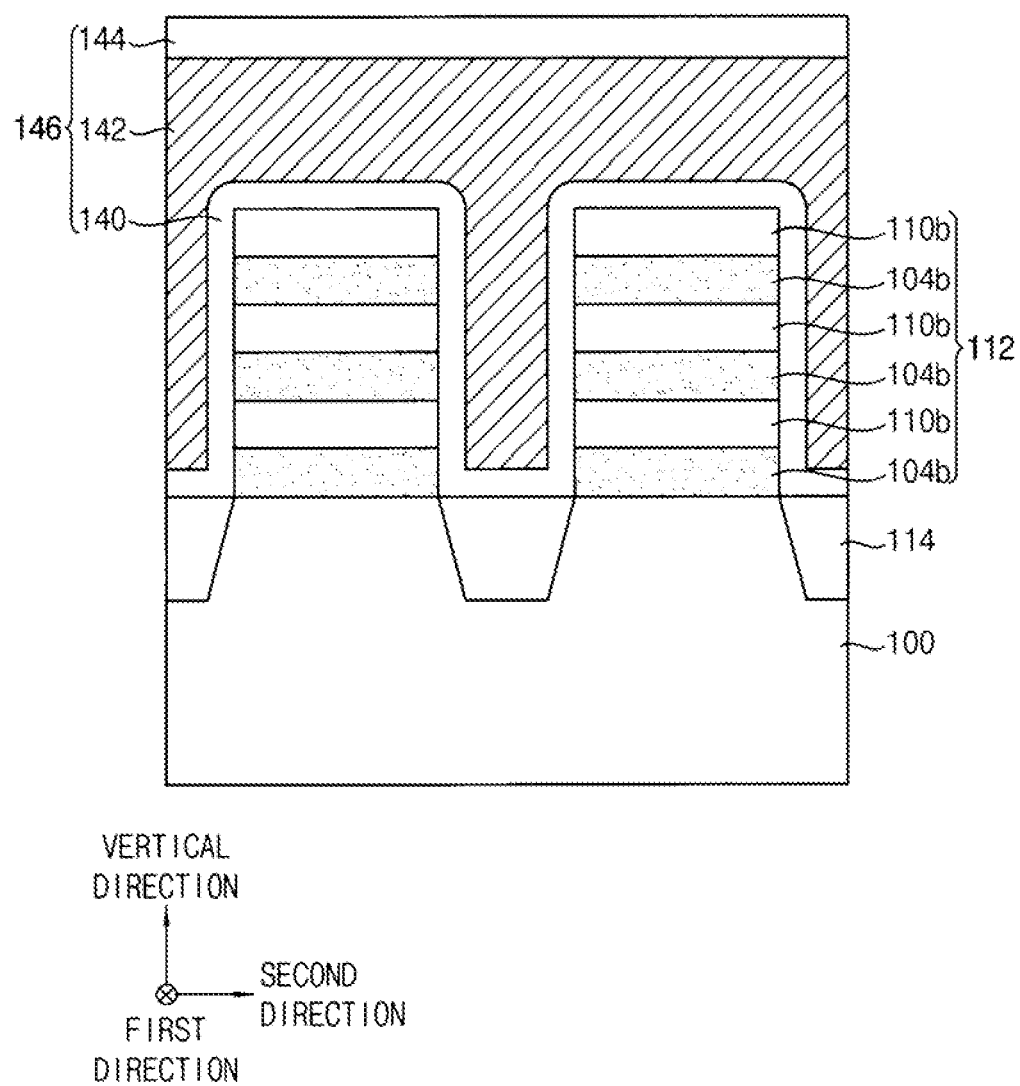
Figure 2:
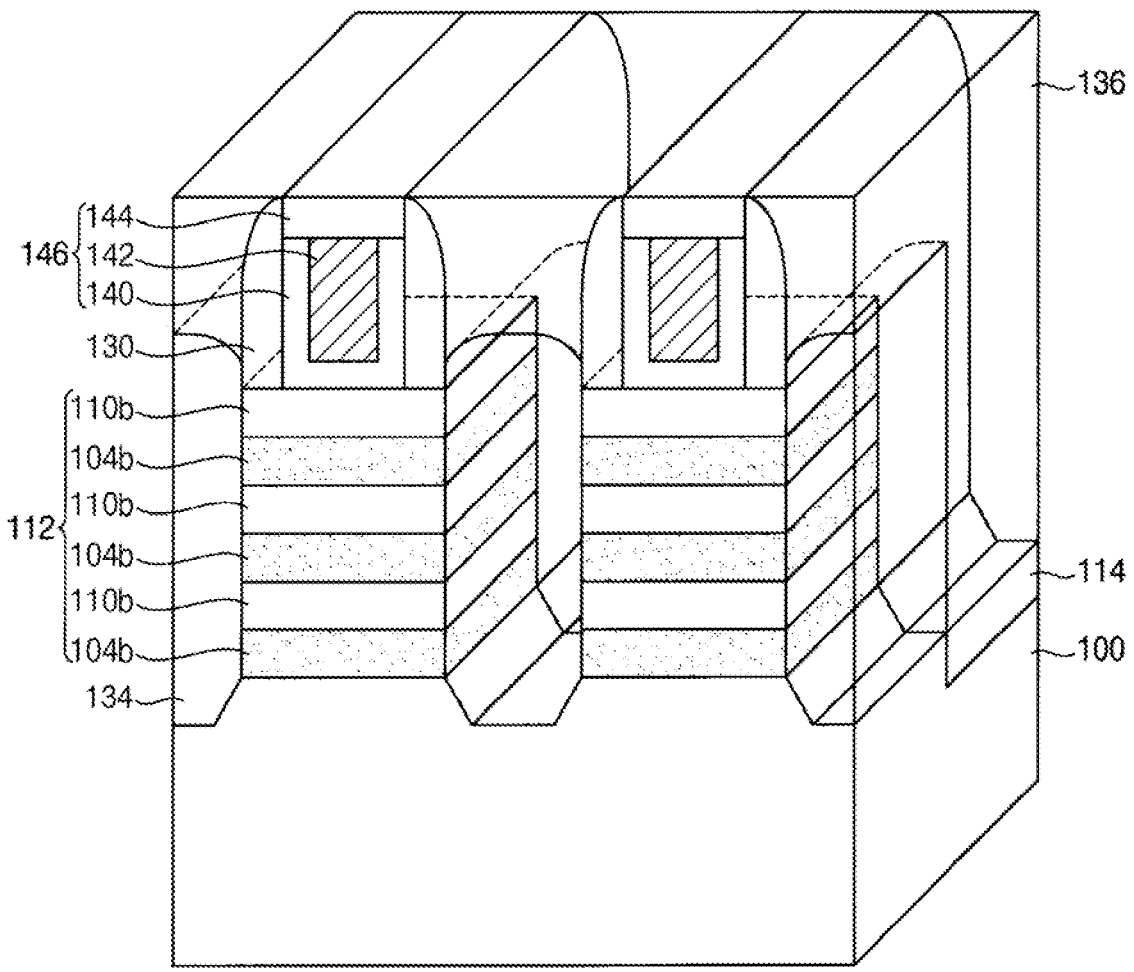

FIG. 1A shows a cross-sectional view of the active structure cut in the first direction. FIG. 1B shows a cross-sectional view of the active structure cut in the second direction.

Referring to FIGS. 1A, 1B, 2 and 3, the semiconductor device may be on a substrate 100, and the semiconductor device may include an active structure 112, a gate structure 146, a third semiconductor layer 134, and an insulation layer 136. The semiconductor device may further include an isolation pattern 114 and a spacer 130. As used herein, the terms "first," "second," etc. are merely to facilitate naming, and are not considered to require the named elements to be provided sequentially (e.g., if a third layer is named, this does not mean that a first layer and a second layer are necessarily present).

The substrate 100 may include a semiconductor material, e.g., silicon, germanium, or silicon-germanium, or a group compound such as GaAs, AlGaAs, InAs, InGaAs, or the like. As used herein, the term "or" is not an exclusive term, e.g., "A or B" would include A, B, or A and B.

The substrate 100 may include a trench extending in the first direction, and the isolation pattern 114 may be in the trench. The isolation pattern 114 may serve as a field region, and the substrate 100 between isolation patterns 114 may serve as an active region. The isolation pattern 114 may include, e.g., an oxide such as silicon oxide.

The active structure 112 may include first semiconductor patterns 104b and second semiconductor patterns 110b alternately and repeatedly stacked in the vertical direction. The active structure 112 may have a pillar shape. A plurality of active structures 112 may be spaced apart from each other in each of the first direction and/or the second direction. The active structures 112 may be arranged to be aligned in each of the first direction and the second direction.

The first semiconductor pattern 104b may include a material different from a material of the second semiconductor pattern 110b. In an implementation, the first semiconductor pattern 104b may include the material having a high etching selectivity with respect to the substrate 100 and the second semiconductor pattern 110b.

In an implementation, the first semiconductor pattern 104b may include silicon germanium doped with silicon. In an implementation, the first semiconductor pattern 104b may include silicon rich-silicon germanium. In an implementation, a concentration of silicon in the first semiconductor pattern may be about 70% or more. In an implementation, in the first semiconductor pattern 104b, the concentration of silicon may be in range of about 70% to about 85%, and the concentration of germanium may be in range of about 15% to about 30%. In an implementation, the silicon rich-silicon germanium may contain silicon atoms and germanium atoms in relative amounts such that silicon predominates. The second semiconductor pattern 110b may include silicon. In an implementation, the second semiconductor pattern 110b may include single crystal silicon. Hereinafter, the first semiconductor pattern 104b is referred to as a silicon germanium pattern, and the second semiconductor pattern 110b is referred to as a silicon pattern.

Figure 5:
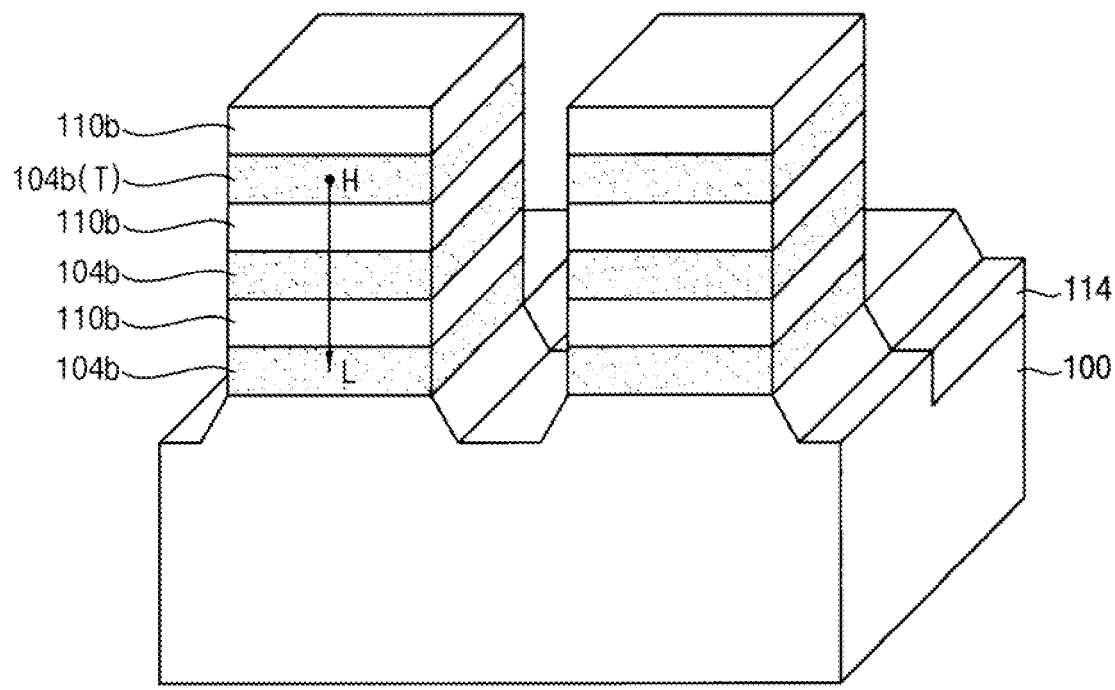
FIGS. 5 to 8 illustrate perspective views of concentrations of silicon in first semiconductor patterns in each of active structures.

In an implementation, the concentration of silicon in the silicon germanium patterns 104b may vary depending on a position in the vertical direction of the silicon germanium patterns 104b included in the active structure 112. In an implementation, in the silicon germanium patterns 104b of the active structure 112, a silicon germanium pattern 104b at a top thereof (e.g., distal to the substrate 100 in the vertical direction) may have a highest concentration of silicon. In an implementation, the concentration of silicon in the silicon germanium patterns 104b may (e.g., gradually) decrease from the top of the active structure 112 to a bottom of the active structure 112 (e.g., proximate to the substrate 100 in the vertical direction). In an implementation, as shown in FIG. 5, the concentration of silicon in the silicon germanium patterns 104b in the active structure 112 may decrease downwardly in the vertical direction perpendicular toward a surface of the substrate 100.

In some fin field effect transistors, on currents of an upper portion of an active fin may flow more than on currents of a lower portion of the active fin. In an implementation, when the concentration of silicon in the silicon germanium patterns 104b (T) at a top portion of the active structure 112 is increased, on currents of the fin field effect transistor may be more increased.

In an implementation, in the active structure 112, the concentration of silicon may be different depending on inner positions in each of silicon germanium patterns 104b (e.g., depending on a horizontal or lateral position within each of silicon germanium patterns 104b).

Figure 6:
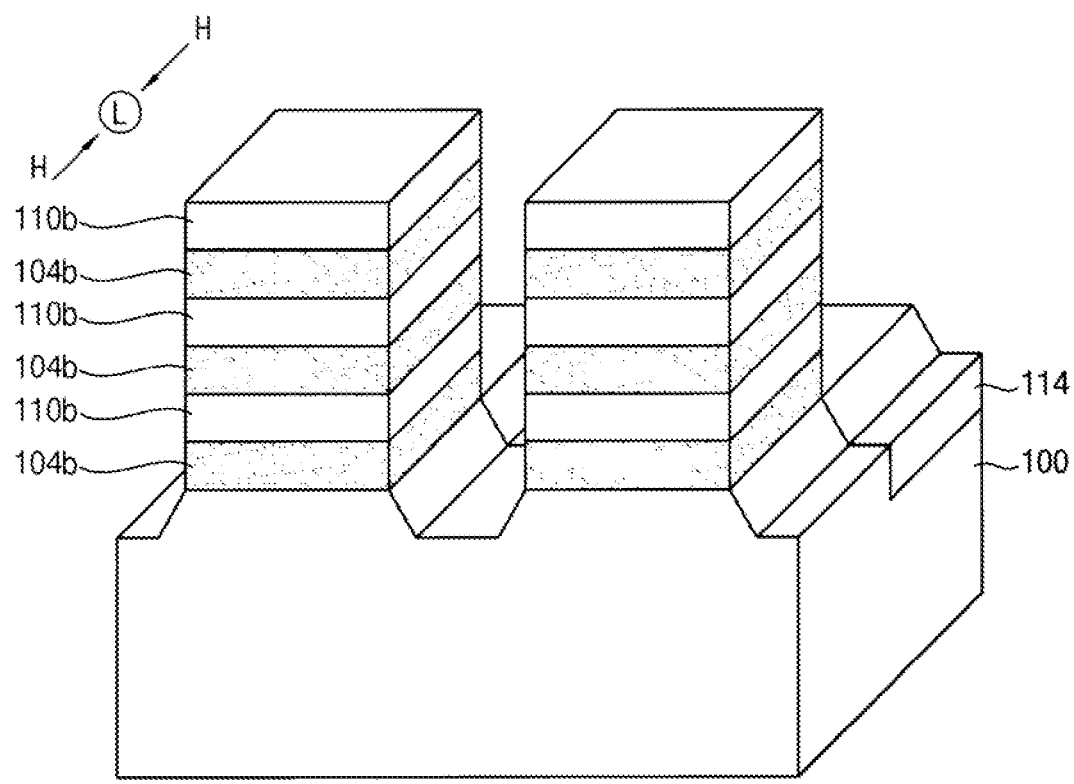

In an implementation, as shown in FIG. 6, both sidewalls that extend lengthwise in the first direction of each of the silicon germanium patterns 104b may have a highest concentration of silicon. The concentration of silicon may be gradually decreased from the sidewalls that extend in the first direction to a center portion thereof (e.g., the silicon concentration may decrease moving inwardly in the second direction in each of the silicon germanium patterns 104b).

Figure 7:
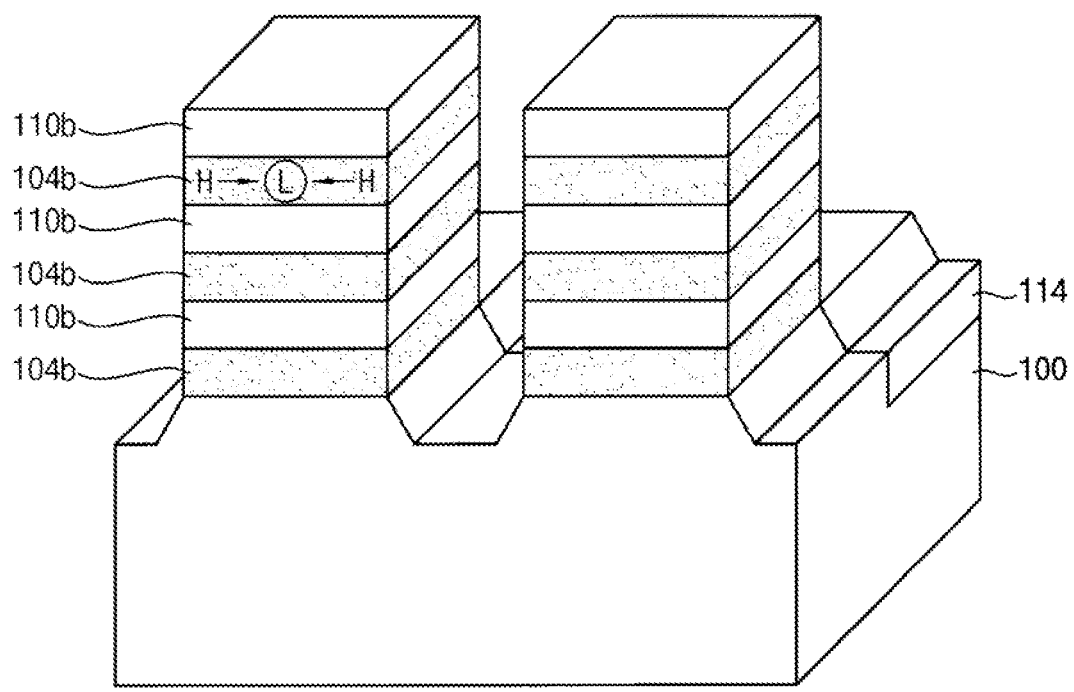

In an implementation, as shown in FIG. 7, both sidewalls that extend lengthwise in the second direction of each of the silicon germanium patterns 104b may have a highest concentration of silicon. The concentration of silicon may be gradually decreased from the sidewalls that extend in the second direction thereof to a center portion thereof (e.g., the silicon concentration may decrease moving inwardly in the first direction in each of the silicon germanium patterns 104b).

Figure 8:
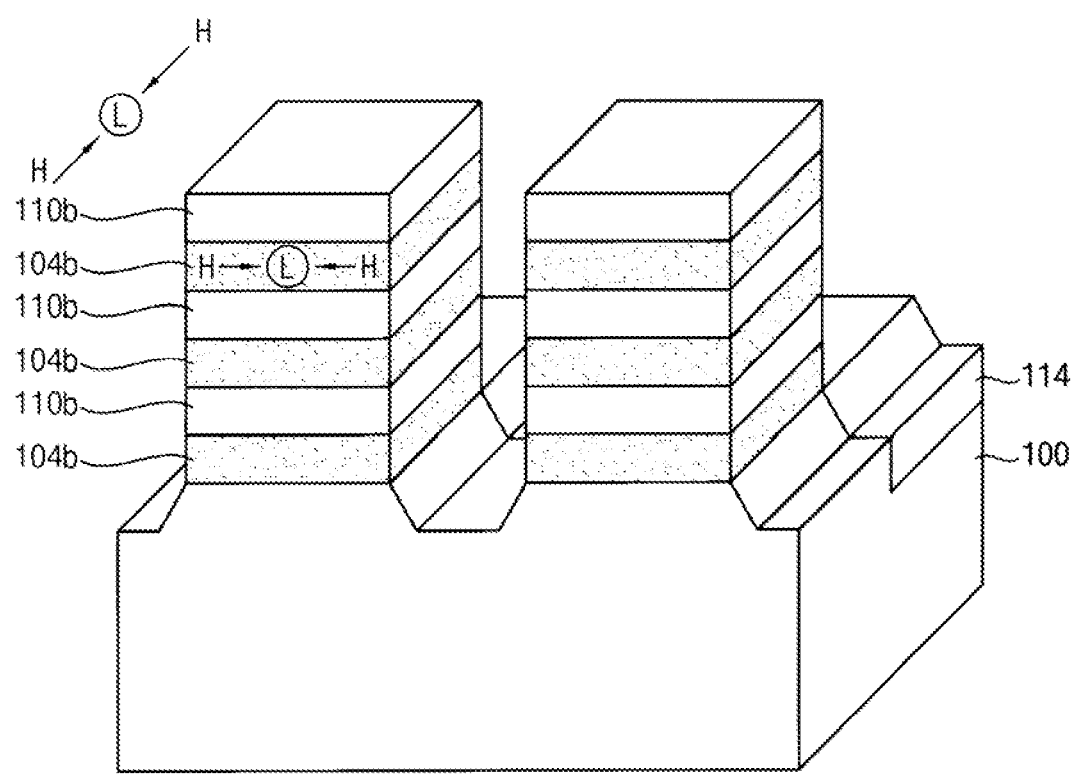

In an implementation, as shown in FIG. 8, sidewalls extending in each of the first and second directions of each of the silicon germanium patterns 104b may have a highest concentration of silicon. The concentration of silicon may be gradually decreased from the sidewalls extending in each of the first and second directions thereof to a center portion thereof (e.g., the silicon concentration may decrease moving inwardly in every direction in each of the silicon germanium patterns 104b).

In an implementation, the concentration of doped silicon in the silicon germanium patterns 104b may be uniform at vertical positions of the silicon germanium patterns 104b and inner positions in each of silicon germanium patterns 104.

The active structure 112 may serve as a channel region of the fin field effect transistor.

The gate structure 146 may be formed on both sidewalls (e.g., facing) in the second direction and on an upper surface of the active structure 112, and the substrate 100. The gate structure 146 may extend in the second direction. In an implementation, the gate structure 146 may cover the both sidewalls and the upper surfaces of the active structures 112 arranged in the second direction. An upper surface of the gate structure 146 may be higher (e.g., farther from the substrate 100 in the vertical direction) than the upper surface of the active structure 112.

The spacer 130 may be on sidewalls of the gate structure 146. The spacer 130 may include, e.g., silicon nitride.

The gate structure 146 may include a gate insulation layer pattern 140, a gate pattern 142, and a hard mask 144.

The gate insulation layer pattern 140 may be conformally formed to cover the both sidewalls (facing in the second direction) and the upper surface of the active structure 112. In an implementation, the gate insulation layer pattern 140 may be formed on an inner sidewall of the spacer 130. Thus, the gate insulation layer pattern 140 may surround a surface of the gate pattern 142. In an implementation, a work function control pattern may be further formed between the gate insulation layer pattern 140 and the gate pattern 142.

In an implementation, a thickness of the gate insulation layer pattern 140 (e.g., from an inner side thereof to an outer side thereof) may be greater than ½ of a height in the vertical direction of one of silicon germanium pattern 104*b*. In this case, even if the silicon germanium pattern 104*b* were to be removed, the gate pattern 142 may not be formed in a removed portion of the silicon germanium pattern 104*b* due to the gate insulation layer pattern 140 having sufficiently thickness. In an implementation, when the thickness of the gate insulation layer pattern 140 is greater than ½ of the height in the vertical direction of one of silicon germanium patterns 104*b*, a multi-bridge channel transistor may not be formed.

The gate pattern 142 may be on the gate insulation layer pattern 140. The gate pattern 142 may be on both sidewalls (facing in the second direction) and the upper surface of the active structure 112.

The hard mask 144 may be on the gate insulation layer pattern 140 and the gate pattern 142.

The gate insulation layer pattern 140 may include, e.g., a metal oxide having a high dielectric constant such as hafnium oxide, tantalum oxide, zirconium oxide, or the like. The work function control pattern may include, e.g., titanium nitride, titanium oxynitride, titanium oxynitride, titanium silicon nitride, titanium silicon oxynitride, titanium aluminum oxynitride, tantalum nitride, tantalum oxynitride, tantalum aluminum nitride, tantalum aluminum oxynitride, tungsten nitride, tungsten carbonitride, aluminum oxide, or the like.

The gate pattern 142 may include, e.g., a metal such as titanium, aluminum, tungsten, an alloy thereof, a nitride thereof, or carbide thereof.

The hard mask 144 may include an insulation material, e.g., silicon nitride.

An outer wall of the spacer 130 may be aligned (e.g., coplanar) with the sidewalls of the active structure 112 in the vertical direction.

The third semiconductor layer 134 may be on surfaces of the active structure 112 and the substrate 100. The third semiconductor layer 134 may be between the active structures 112 in the first direction. The third semiconductor layer 134 may serve as source/drain regions of the transistor. In an implementation, the third semiconductor layer 134 may include a semiconductor material doped with impurities. In an implementation, the third semiconductor layer 134 may include silicon. In an implementation, the third semiconductor layer 134 may include silicon germanium.

In an implementation, an upper surface (e.g., surface that faces away from the substrate 100 in the vertical direction) of the third semiconductor layer 134 may be higher than an upper surface of the active structure 112, and may be lower (e.g., closer to the substrate 100 in the vertical direction) than an upper surface of the hard mask 144 of the gate structure 146.

The insulation layer 136 may be on the substrate 100 and the third semiconductor layer 134. The insulation layer 136 may fill a gap between the gate structures 146. An upper surface of the insulation layer 136 may be coplanar with an upper surface of the gate structure 146. The insulation layer 136 may include, e.g., an oxide such as silicon oxide.

In an implementation, the semiconductor device may further include contact plugs and wirings that are electrically connected to the third semiconductor layer 134 and/or the gate structure 146.

As described above, the semiconductor device may include the fin field effect transistor on the active structure 112. In an implementation, the active structure 112 may include the silicon germanium patterns 104*b* and the silicon patterns 110*b*, which are different semiconductor materials, alternately stacked. Thus, a difference of energy bands between the silicon germanium pattern 104*b* and the silicon pattern 110*b* in the active structure 112 may occur.

As shown in FIG. 4, the active structure may have a structure in which the silicon germanium patterns and the silicon patterns are alternately stacked, so that a potential barrier between the silicon germanium pattern and the silicon pattern may be high (see dotted line). Thus, a channel may be formed only at the silicon pattern, and the channel may be hardly formed at the silicon germanium pattern. Therefore, on currents of the fin field effect transistor may be greatly decreased.

In an implementation, the silicon germanium pattern 104*b* may be doped with silicon. The silicon germanium pattern 104*b* may be silicon rich-silicon germanium, so that the potential barrier between the silicon germanium pattern 104*b* and the silicon pattern 110*b* may be decreased. Thus, a potential well may be lowered or a slope of the potential well may be gentle. (see solid line). Therefore, the channel may be formed not only at the silicon pattern 110*b* but also at a portion of the silicon germanium pattern 104*b*, and thus on currents of the fin field effect transistor may be increased.

FIGS. 9 to 19 are cross-sectional views, plan views, and perspective views of stages in a method of manufacturing a semiconductor device in accordance with example embodiments.

Figure 9:
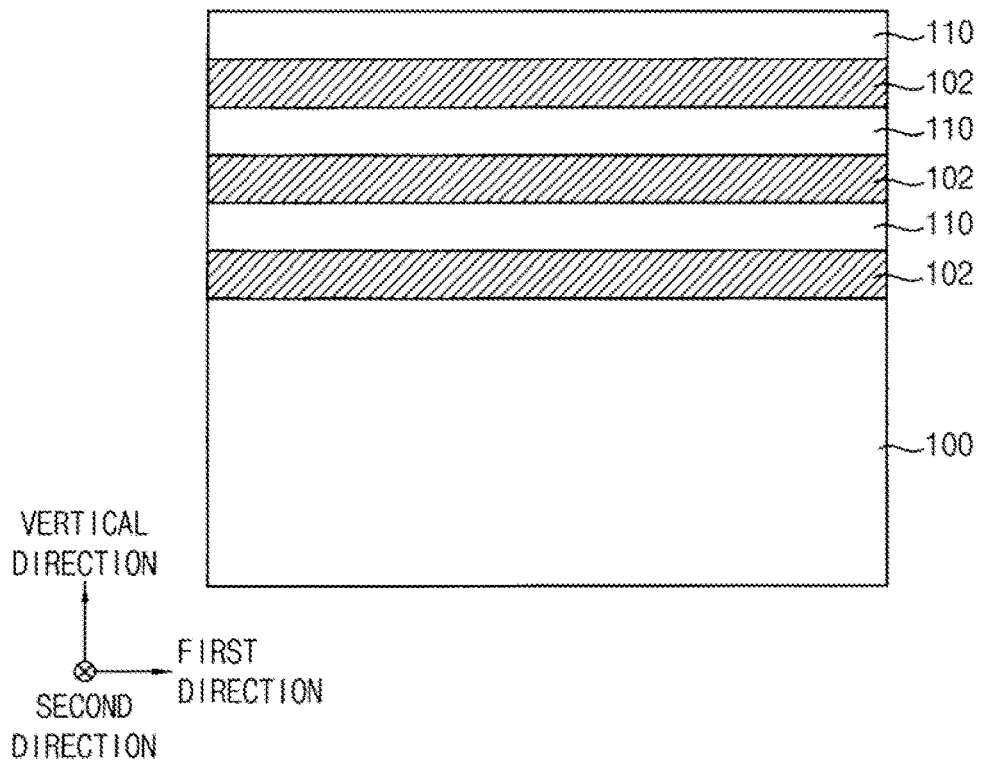
FIGS. 9 to 19 illustrate cross-sectional views, plan views, and perspective views of stages in a method of manufacturing a semiconductor device in accordance with example embodiments.
Figure 10:
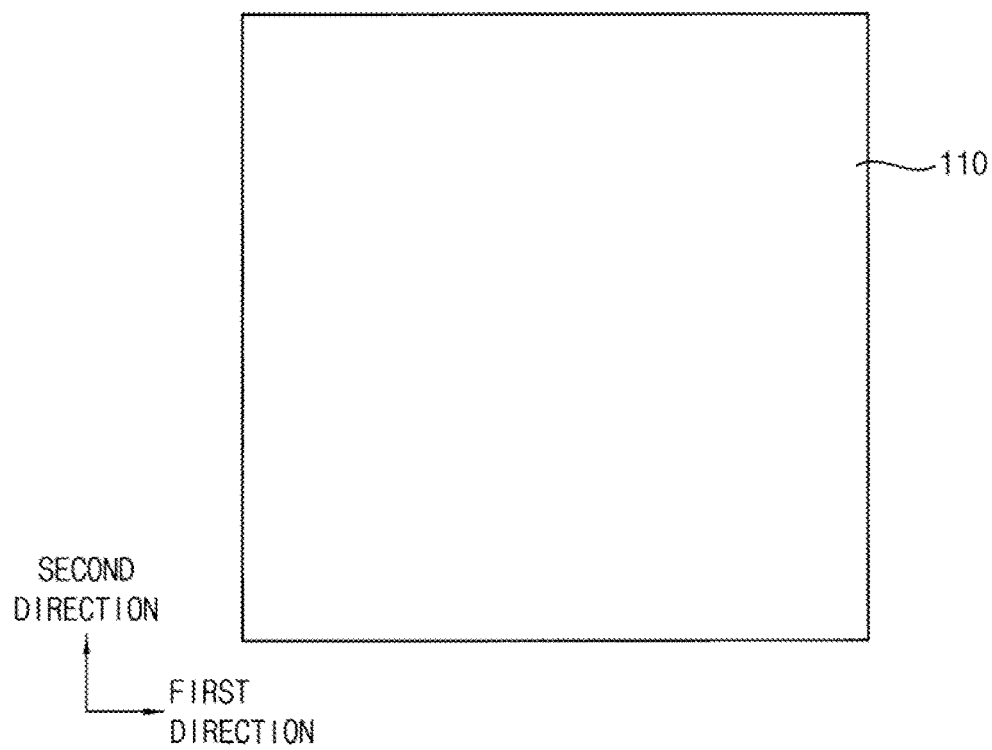
Figure 11:
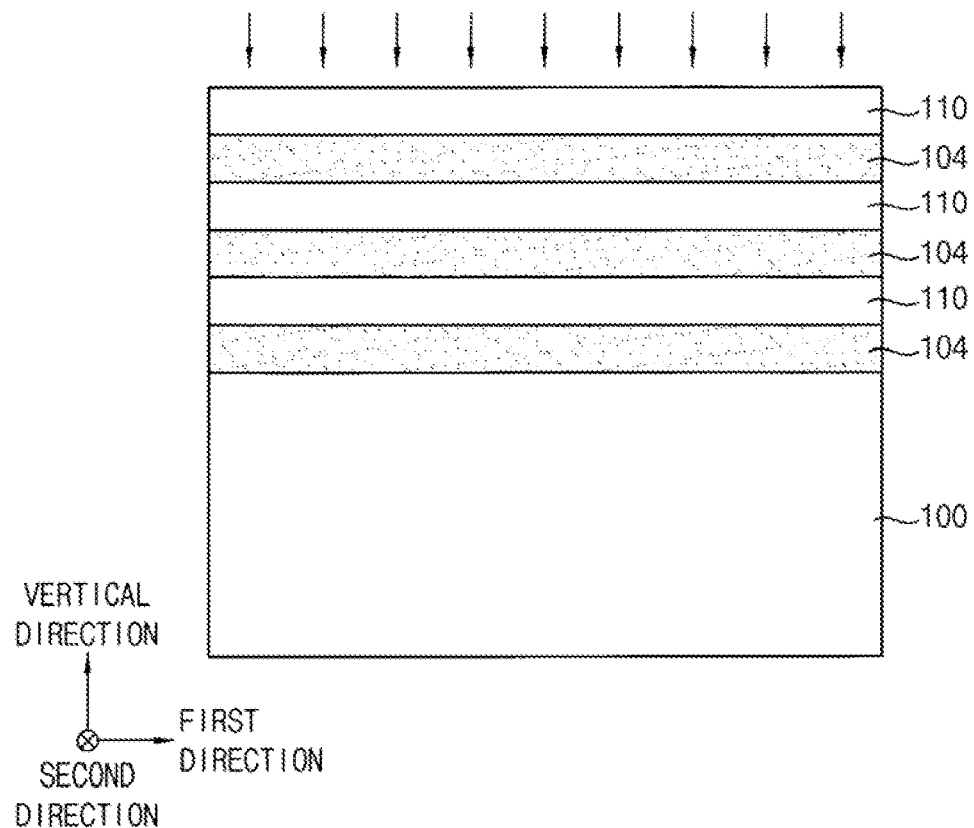
Figure 12:
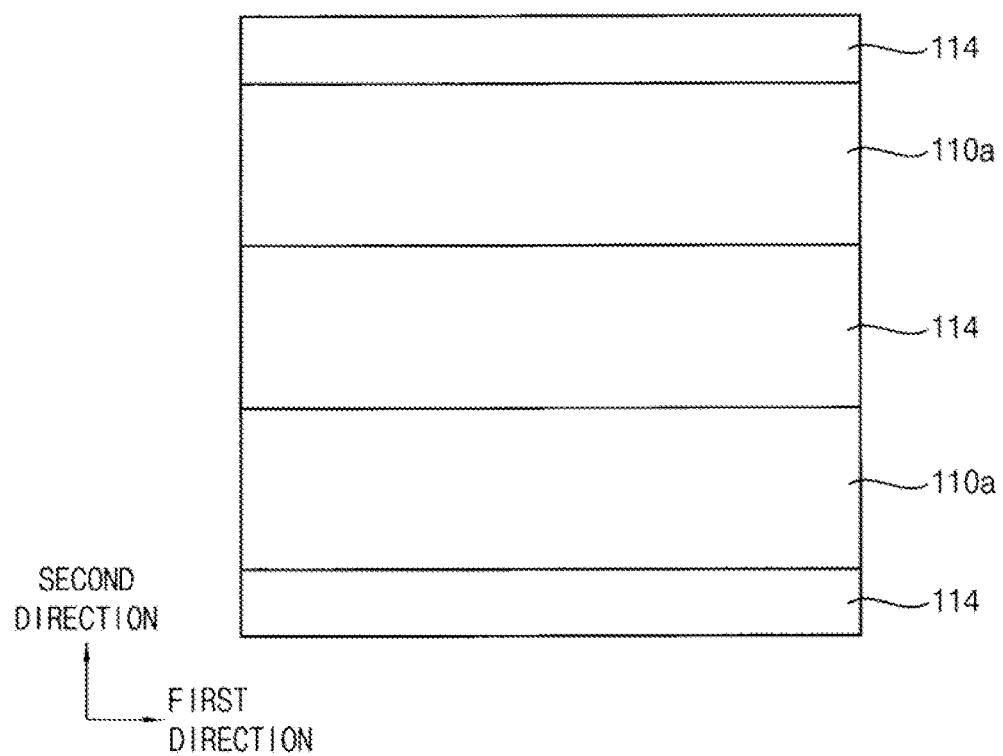
Figure 13:
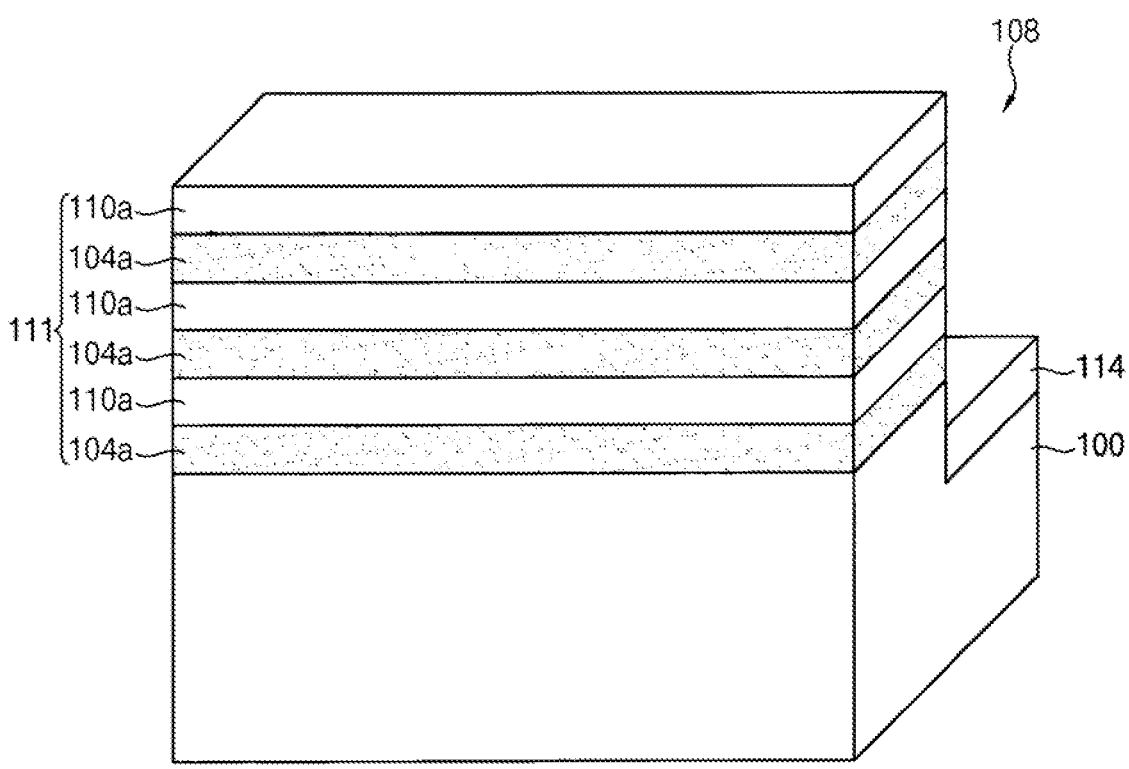
Figure 13:
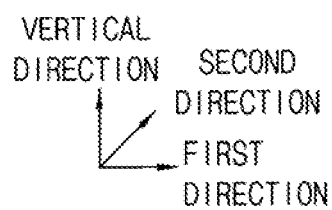
Figure 14:
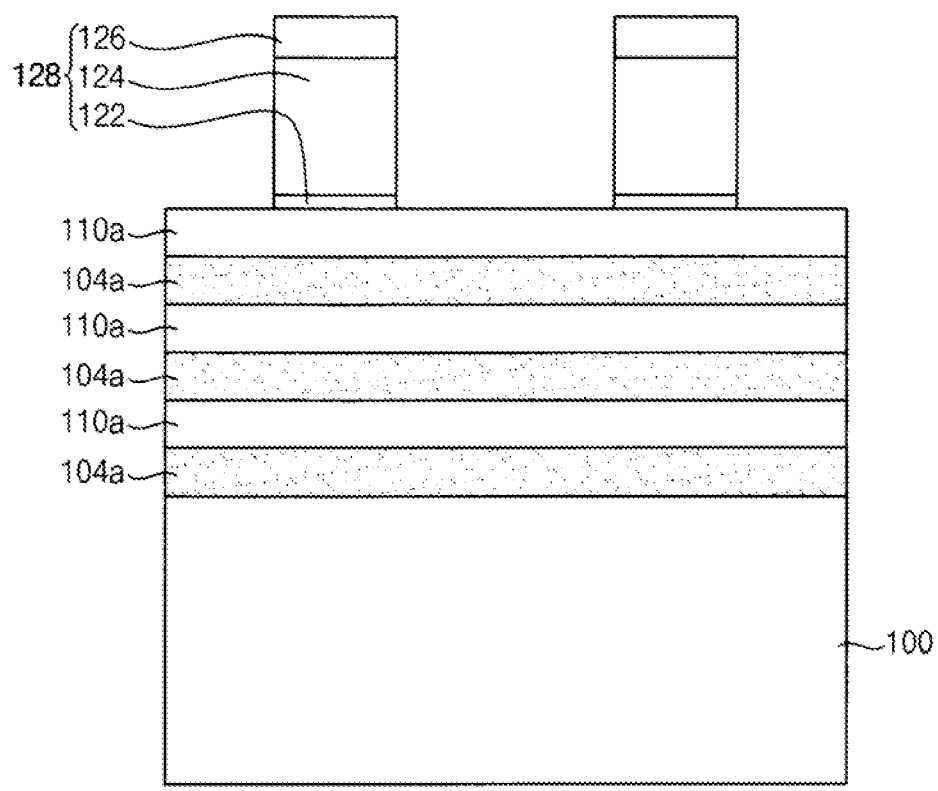
Figure 15:
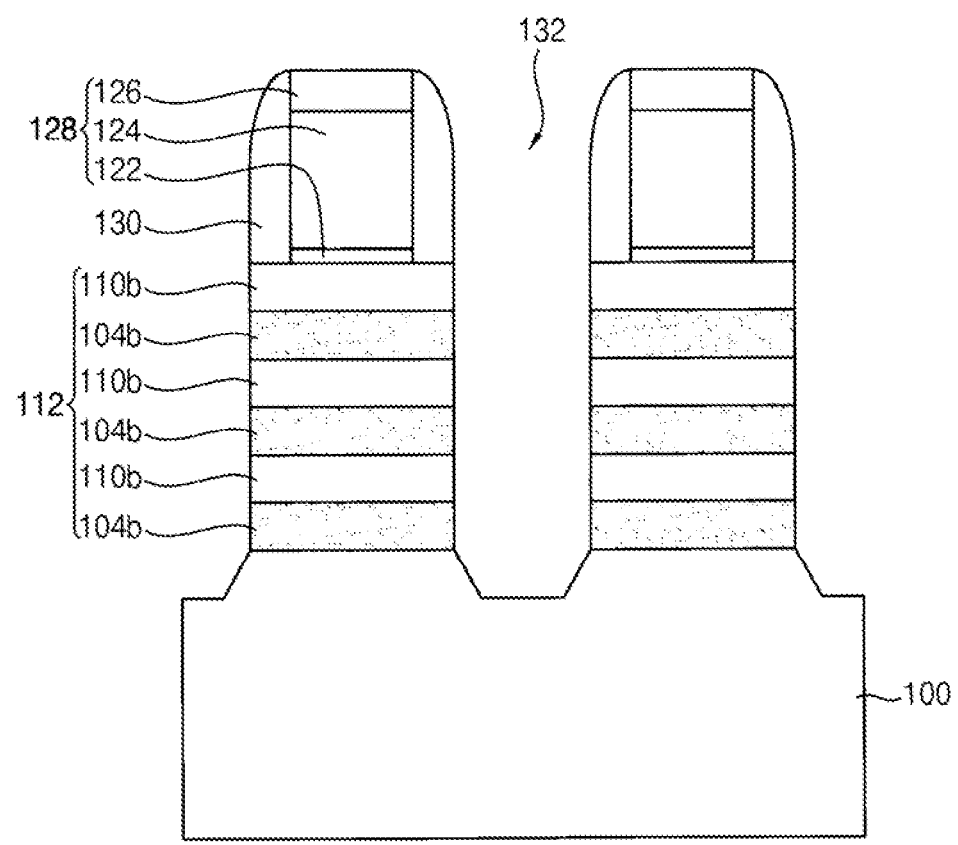
Figure 15:
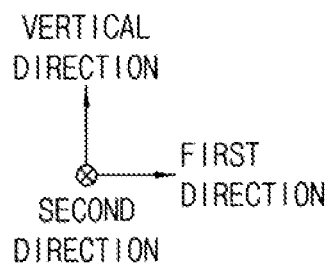
Figure 16:
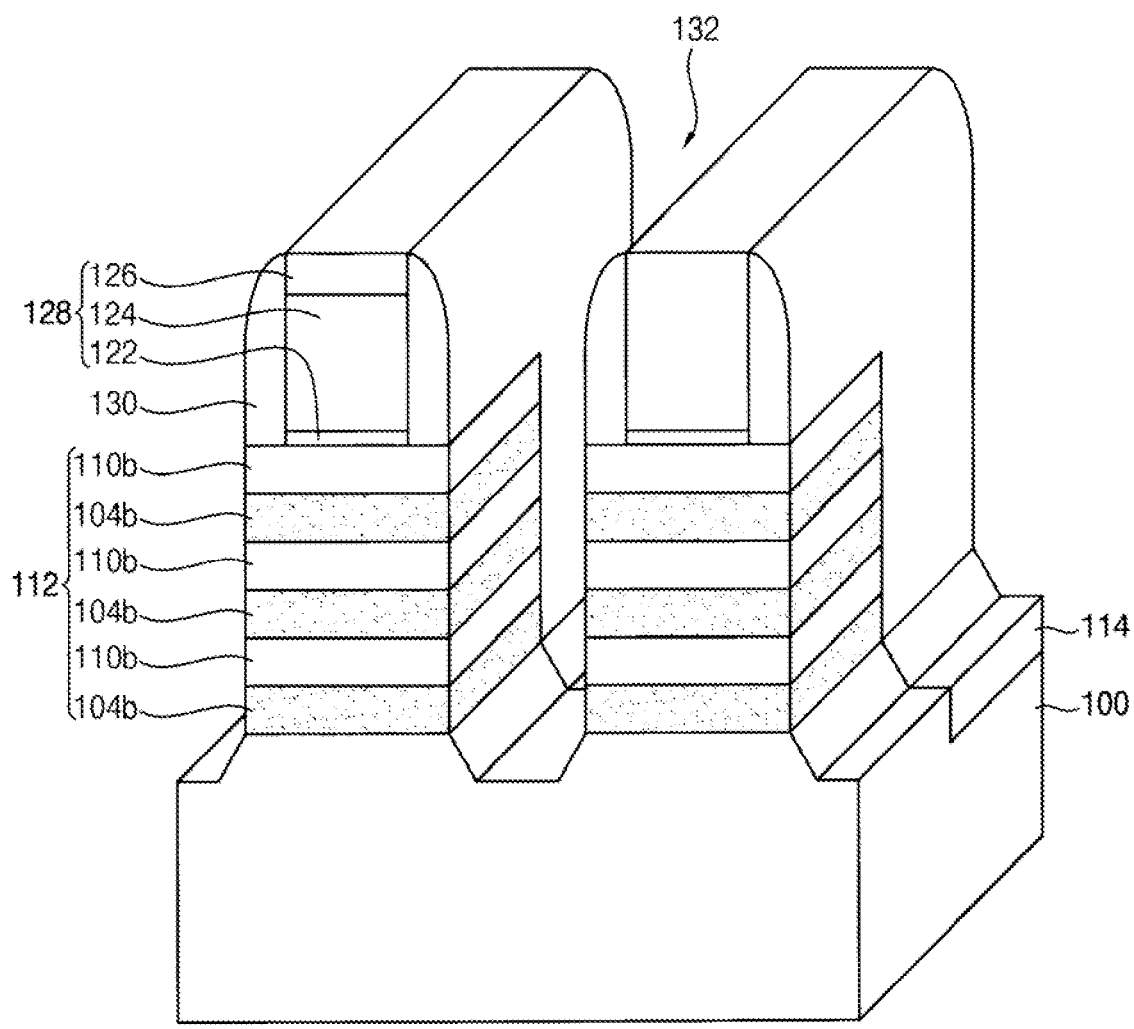
Figure 17:
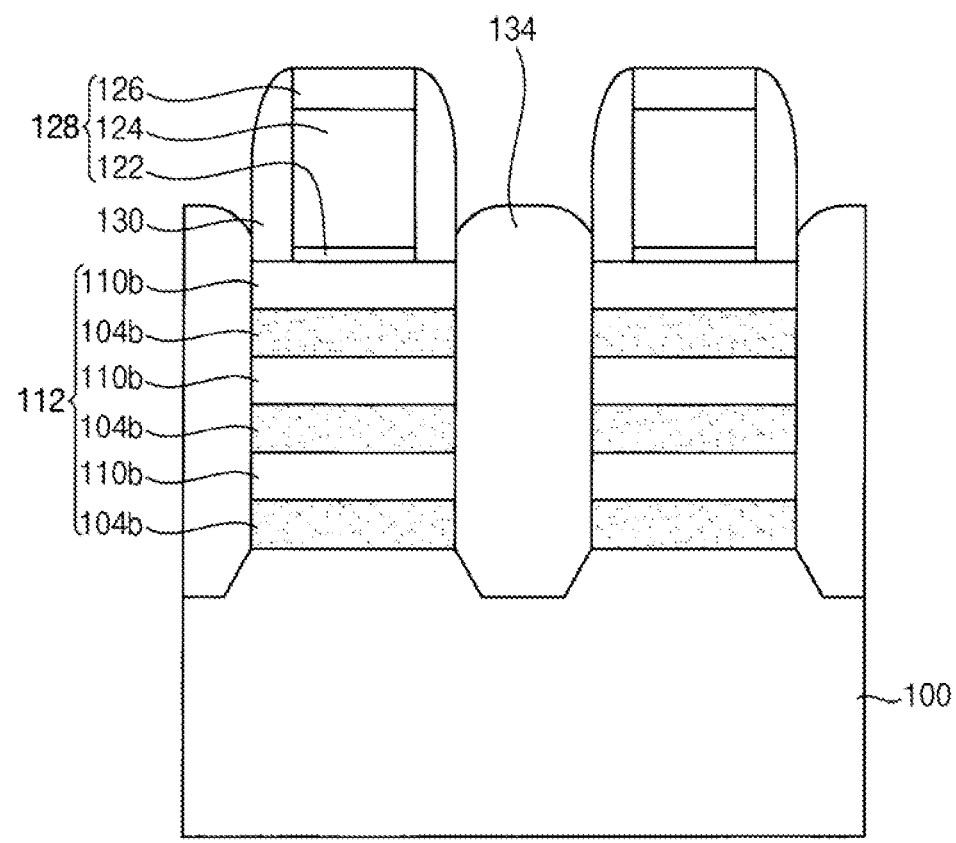
Figure 17:
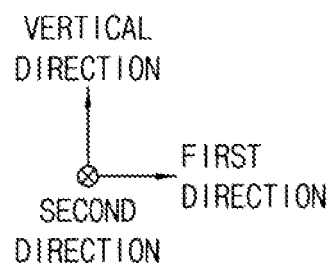
Figure 18:
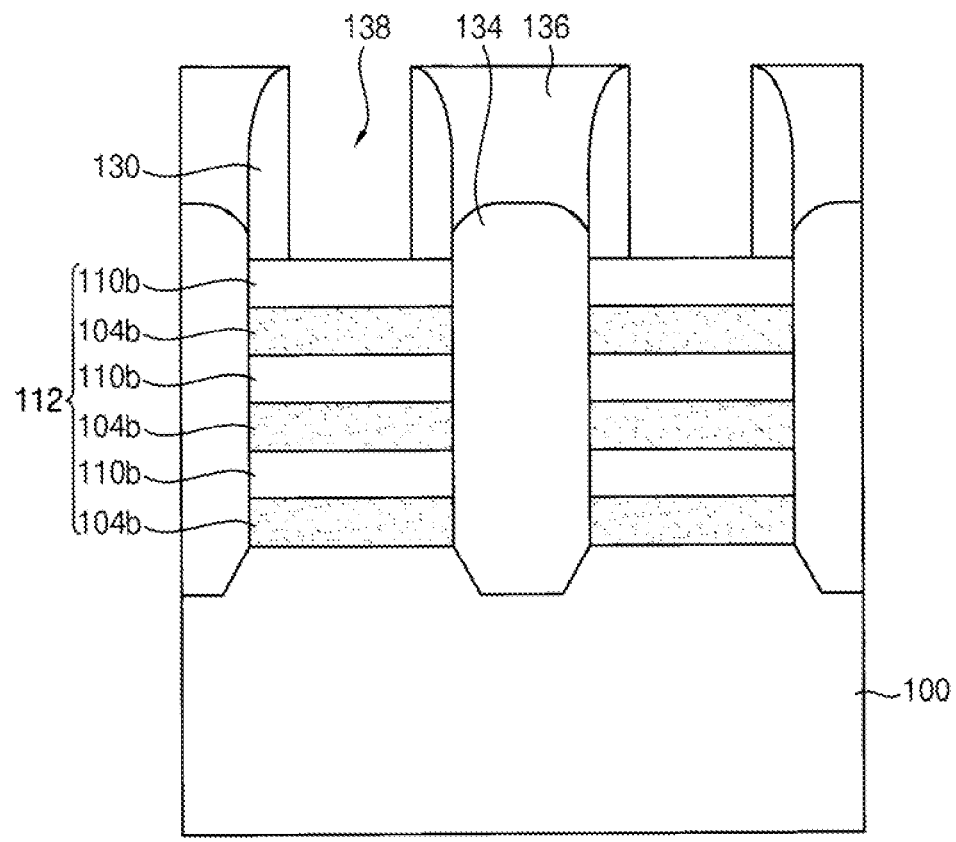
Figure 19:
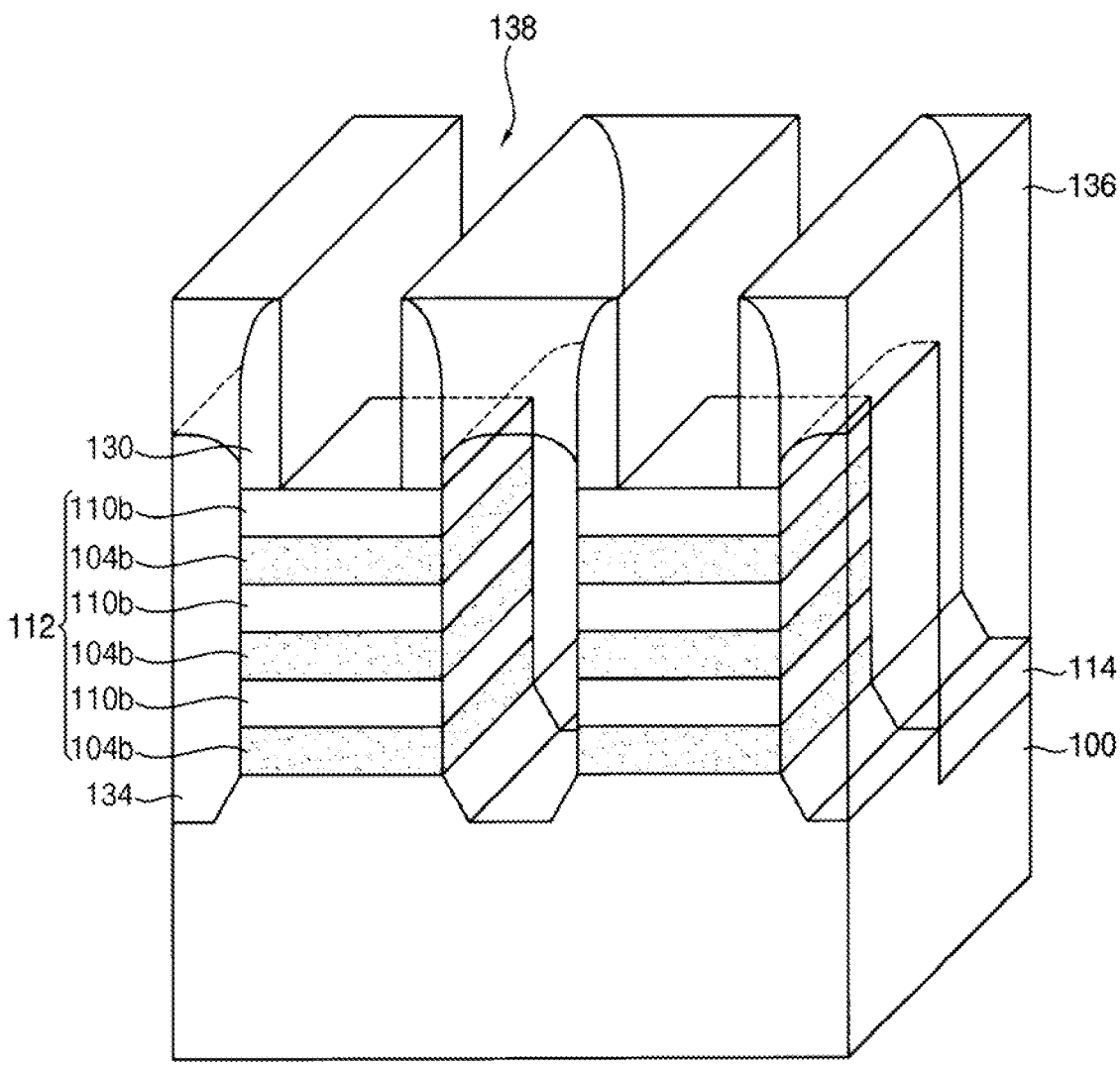

FIGS. 9, 11, 14, 15, 17 and 18 are the cross-sectional views, FIGS. 10 and 12 are the plan views, and FIGS. 13, 16 and 19 are the perspective views.

Referring to FIGS. 9 and 10, preliminary first semiconductor layers 102 and second semiconductor layers 110 may be alternately and repeatedly stacked on the substrate 100 to form a stacked layer including the preliminary first semiconductor layers 102 and the second semiconductor layers 110. In this case, an uppermost layer of the stacked layer may be the second semiconductor layer 110.

In an implementation, the second semiconductor layer 110 may include a material substantially the same as a material of the substrate 100. The preliminary first semiconductor layer 102 may include a material different from the material of the second semiconductor layer 110. In an implementation, the preliminary first semiconductor layer 102 may include the material having a high etching selectivity with respect to the substrate 100 and the second semiconductor layer 110.

In an implementation, the second semiconductor layer 110 may be a silicon layer, and the preliminary first semiconductor layer 102 may be a silicon-germanium layer. In an implementation, the preliminary first semiconductor layer 102 may be a silicon germanium layer including about 67% to about 70% of silicon and about 30% to about 33% of germanium. In an implementation, the second semiconductor layer 110 may be single crystal silicon.

In an implementation, the second semiconductor layer 110 and the preliminary first semiconductor layer 102 may be formed by an epitaxial growth process.

Referring to FIG. 11, the stacked layer including the preliminary first semiconductor layers 102 and the second semiconductor layers 110 may be doped with silicon by ion implantation process. Silicon ions may be implanted in a direction perpendicular to an upper surface of the preliminary first semiconductor layer 102 (e.g., the vertical direction).

When the ion implantation process is performed, a concentration of silicon in the preliminary first semiconductor layer 102 may be increased to form a first semiconductor layer 104. In an implementation, the first semiconductor layer 104 may be a silicon rich-silicon germanium layer having a concentration of the silicon higher than a concentration of silicon in the preliminary first semiconductor layer 102.

In an implementation, silicon may be implanted to the surface of the substrate 100 in the vertical direction by the ion implantation process. In this case, the first semiconductor layer 104 at a top of the stacked layer may be doped to have the highest concentration of the silicon. Therefore, the first semiconductor layer 104 formed at a top of the stacked layer may have the highest concentration of silicon. Also, the concentration of silicon in the first semiconductor patterns 104 may be gradually decreased from the top of the stacked layer to a bottom of the stacked layer. In an implementation, when the ion implantation process is performed as described above, a semiconductor device as described with reference to FIG. 5 may be manufactured by subsequent processes.

As the second semiconductor layer 110 is a silicon layer, physical properties of the second semiconductor layer 110 may not be changed after performing the ion implantation process.

As described above, the first semiconductor layer 104 may be doped with the silicon, so that a potential well between the first semiconductor layer 104 and the second semiconductor layer 110 may be lowered or a slope of the potential well may be gentle.

Referring to FIGS. 12 and 13, a hard mask extending in the first direction may be formed on an uppermost second semiconductor layer 110, and the first semiconductor layer 104, the second semiconductor layers 110, and an upper portion of the substrate 100 may be etched using the hard mask as an etching mask.

Thus, a preliminary active structure 111 extending in the first direction may be formed on the substrate 100. The preliminary active structure 111 may include preliminary first semiconductor patterns 104a and preliminary second semiconductor patterns 110a alternately and repeatedly stacked. In an implementation, a plurality of the preliminary active structures 111 may be formed on the substrate 100 to be spaced apart from each other in the second direction. An opening 108 may be formed between the preliminary active structures 111.

An isolation pattern 114 may be formed at the substrate 100 between the preliminary active structures 111. Thereafter, the hard mask may be removed.

Referring to FIG. 14, a dummy gate structure 128 extending in the second direction may be formed on the preliminary active structure 111 and the isolation pattern 114.

In an implementation, the dummy gate structure 128 may include a dummy gate insulation layer 122, a dummy gate pattern 124, and a dummy hard mask 126. The dummy gate insulation layer 122 may include, e.g., an oxide such as silicon oxide, and the dummy gate pattern 124 may include, e.g., polysilicon. The dummy hard mask 126 may include e.g., a nitride such as silicon nitride.

In an implementation, a plurality of the dummy gate structures 128 may be arranged to be spaced apart from each other in the first direction.

Referring to FIGS. 15 and 16, spacers 130 may be formed on sidewalls of the dummy gate structure 128.

Thereafter, the preliminary active structure 111 may be etched using the dummy gate structure 128 and the spacer 130 as an etching mask, so that an upper surface of the substrate 100 may be exposed.

Thus, the preliminary active structure 111 may be cut to form active structures 112. Each of the active structures 112 may include first semiconductor patterns 104b and second semiconductor patterns 110b alternately and repeatedly stacked.

Further, a first opening 132 may be formed between the active structures 112 spaced apart from each other in the first direction, and the first opening 132 may extend in the second direction. Sidewalls of the first and second semiconductor patterns 104b and 110b and the surface of the substrate 100 may be exposed by the first opening 132.

Referring to FIG. 17, a third semiconductor layer 134 may be formed on the surface of the substrate 100 and the first and second semiconductor patterns 104b and 110b exposed by the first opening 132.

In an implementation, the third semiconductor layer 134 may be formed by a selective epitaxial growth (SEG) process while doping impurities in situ.

In an implementation, the third semiconductor layer 134 may be formed to fill a gap between the active structures 112 spaced apart in the first direction.

In an implementation, an upper surface of the third semiconductor layer 134 may be higher than an upper surface of the active structure 112, and may be lower than a lower surface of the dummy hard mask 126.

Referring to FIGS. 18 and 19, an insulation layer 136 may be formed to cover the active structure 112, the third semiconductor layer 134, and the dummy gate structure 128. Thereafter, the insulation layer 136 may be planarized until an upper surface of the dummy gate pattern 124 is exposed. In the planarization process, the dummy hard mask 126 may be removed together, and the upper portion of the spacer 130 may be partially removed. The planarization process may be performed by a chemical mechanical polishing (CMP) process and/or an etch back process.

Thereafter, the dummy gate pattern 124 and the dummy gate insulation layer 122 under the dummy gate pattern 124 may be removed to form a second opening 138. The second opening 138 may extend in the second direction.

The (e.g., inner) sidewalls of the spacer 130 that extend lengthwise in the second direction may be exposed by the second openings 138. Portions of sidewalls facing in the second direction of the active structure 112 may be exposed by the second openings 138.

Referring FIGS. 1A and 1B to 3 again, a gate structure 146 filling the second opening 138 may be formed on the substrate 100.

An oxide layer may be formed on the active structure 112 exposed by the second opening 138, and a gate insulation layer may be conformally formed on the oxide layer, an inner wall of the spacer 130 and an upper surface of the insulation layer 136. A gate electrode layer may be formed on the gate insulation layer to fill the second opening 138. In an implementation, a work function control layer may be further formed between the gate insulation layer and the gate electrode layer.

The gate insulation layer, the work function control layer, and the gate electrode layer may be formed by a CVD process, an ALD process, or a physical vapor deposition (PVD) process.

Thereafter, the gate electrode layer and the gate insulation layer may be planarized until an upper surface of the insulation layer 136 is exposed to form the gate insulation layer pattern 140 and the gate pattern 142, respectively. Upper portions of the gate insulation layer pattern 140 and the gate pattern 142 may be partially etched to form a recess, and a hard mask 144 may be formed in the recess. Thus, the hard mask 144 may cover upper surfaces of the gate insulation layer pattern 140 and the gate pattern 142.

As described above, the active structure 112 may have a structure in which the first semiconductor patterns 104b and the second semiconductor patterns 110b are alternately stacked. A fin field effect transistor may be formed on the active structure 112. In the active structure 112, the first semiconductor pattern 104b may include silicon rich-silicon germanium, and the second semiconductor pattern 110b may include silicon. Thus, the potential barrier between the first and second semiconductor patterns 104b and 110b may be decreased, so that the potential well may be lowered or the slope of the potential well may be gentle. Therefore, on currents of the fin field effect transistor may be increased.

In the above described method, the ion implantation process of silicon into the preliminary first semiconductor layer illustrated with reference to FIG. 11 may be performed at another stage. In an implementation, the ion implantation process of silicon may be performed at least once in at least one of stages of exposing the preliminary first semiconductor layer, the preliminary first semiconductor pattern, or the first semiconductor pattern. According to the ion implantation process of silicon, a concentration of silicon may vary depending on positions of the first semiconductor patterns 104b in the active structure 112.

In an implementation, the ion implantation process of silicon may be performed after forming the preliminary active structure 111 (refer to FIGS. 12 and 13). In an implementation, silicon ions may be implanted into the preliminary active structure 111, after the processes illustrated in FIGS. 9, 10, 12 and 13.

In an implementation, the silicon ions may be implanted in a direction perpendicular to an upper surface of the preliminary active structure 111. In this case, a concentration of silicon in the preliminary first semiconductor patterns 104a may be gradually decreased from a top of the preliminary active structure 111 to a bottom of the preliminary active structure 111. Then, subsequent processes illustrated with reference to FIGS. 14 to 19 and FIGS. 1A and 1B to 3 may be performed to manufacture a semiconductor device. In the semiconductor device, each of the first semiconductor patterns 104b may have the concentration of silicon as illustrated in FIG. 5.

In an implementation, the silicon ions may be implanted in an inclined direction with respect to the upper surface of the preliminary active structure 111. Therefore, the silicon ions may be implanted into both sidewalls facing in the second direction of the preliminary active structure 111. In this case, the concentration of silicon in the preliminary first semiconductor patterns 104a may be gradually decreased toward a center portion of the preliminary active structure 111 from the sidewalls in the second direction of the preliminary active structure 111. Then, subsequent processes illustrated with reference to FIGS. 14 to 19 and FIGS. 1A and 1B to 3 may be performed to manufacture a semiconductor device. In the semiconductor device, each of the first semiconductor patterns 104b may have the concentration of silicon as illustrated with reference to FIG. 6.

In an implementation, the ion implantation process of silicon may be performed after forming the active structure 112 (refer to FIGS. 15 and 16). In an implementation, silicon ions may be implanted into the active structure 112, after the processes illustrated in FIGS. 9, 10 and 12 to 16.

In an implementation, the silicon ions may be implanted in an inclined direction with respect to the upper surface of the active structure 112. Thus, the silicon ions may be implanted into both sidewalls facing in the first direction of the active structure 112 exposed by the first opening 132 (refer to FIG. 16). In this case, the concentration of silicon in the first semiconductor patterns 104b may be gradually decreased toward a center portion of the active structure 112 from both sidewalls in the first direction of the active structure 112. Then, subsequent processes illustrated with reference to FIGS. 17 to 19 and FIGS. 1A and 1B to 3 may be performed to manufacture a semiconductor device. In the semiconductor device, each of the first semiconductor patterns 104b may have the concentration of silicon as illustrated with reference to FIG. 7.

In an implementation, the ion implantation process of silicon may be performed after forming the second openings 138 (refer to FIGS. 18 and 19). In an implementation, silicon ions may be implanted, after the processes illustrated in FIGS. 9 and 10 and FIGS. 12 to 19.

In an implementation, the silicon ions may be implanted in an inclined direction with respect to the upper surface of the active structure 112. Thus, the silicon ions may be implanted into sidewalls of the active structure 112 exposed by the second opening 138. In this case, a concentration of the silicon in the first semiconductor patterns 104b may be gradually decreased toward the center portion of the active structure 112 from the sidewalls facing in the second direction of the active structure 112. Then, subsequent processes illustrated with reference to FIGS. 1A and 1B to 3 may be performed to manufacture a semiconductor device. In the semiconductor device, each of the first semiconductor patterns 104b may have the concentration of silicon as illustrated with reference to FIG. 6.

In an implementation, the silicon ions may be implanted into sidewalls facing in each of the first and second directions of the active structure 112. In an implementation, the ion implantation processes may be performed two or more times. Thus, each of the first semiconductor patterns 104b may have the concentration of silicon as illustrated with reference to FIG. 8.

Figure 20:
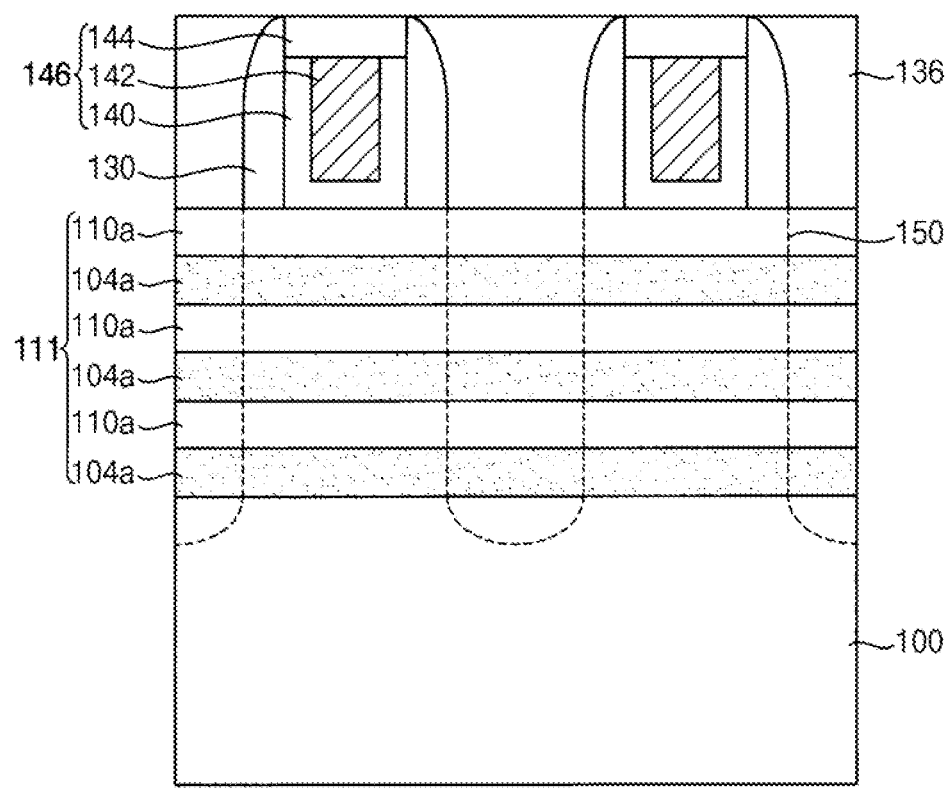
FIGS. 20 and 21 illustrate a cross-sectional view and a perspective view of a semiconductor device in accordance with example embodiments.
Figure 21:
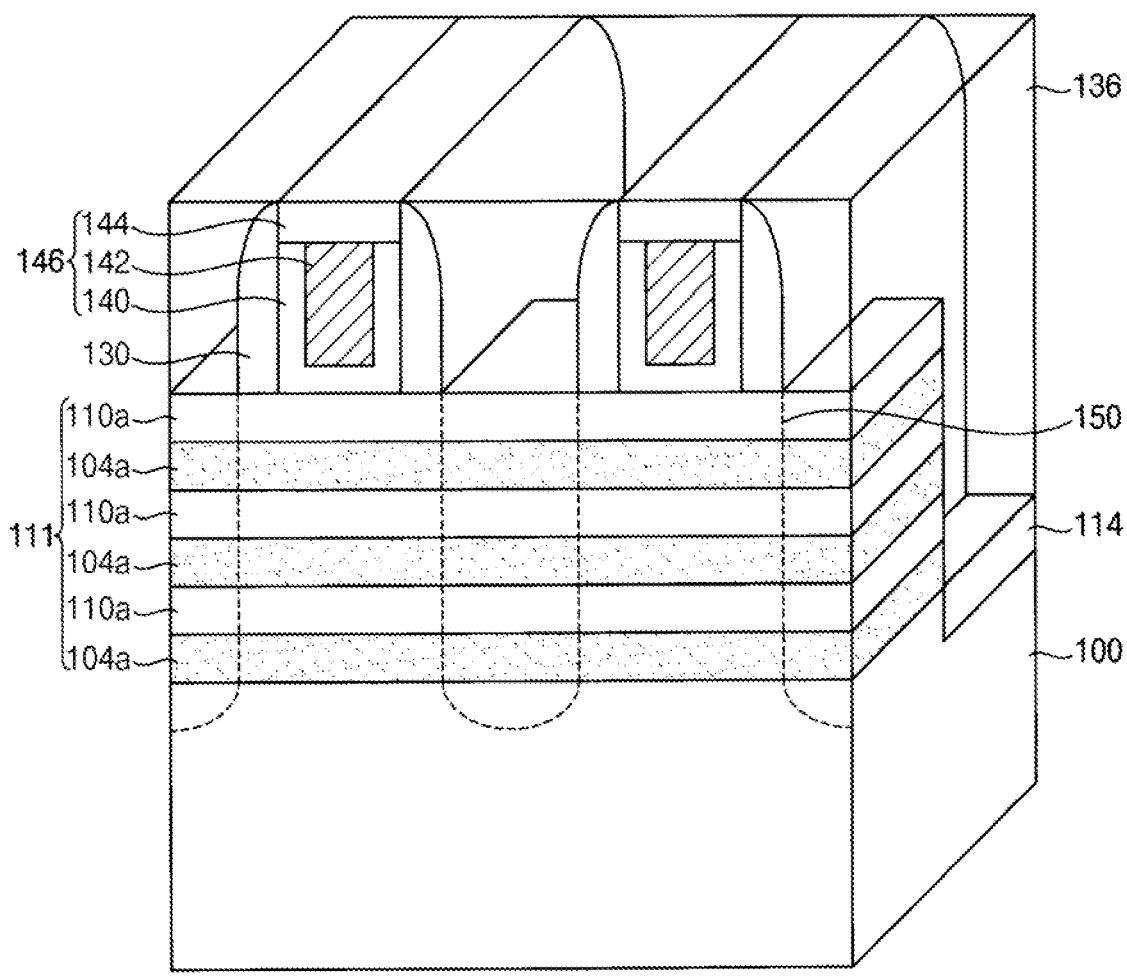
Figure 22:
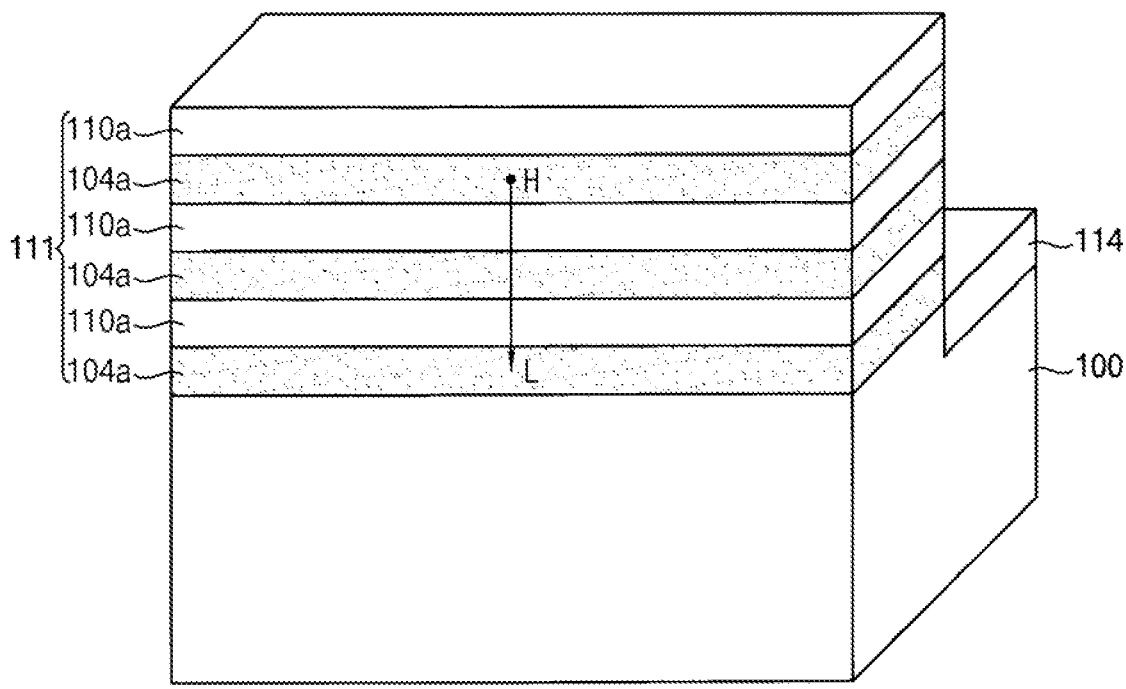
FIGS. 22 and 23 illustrate perspective views of concentrations of silicon in preliminary first semiconductor patterns in each of active structures.
Figure 23:
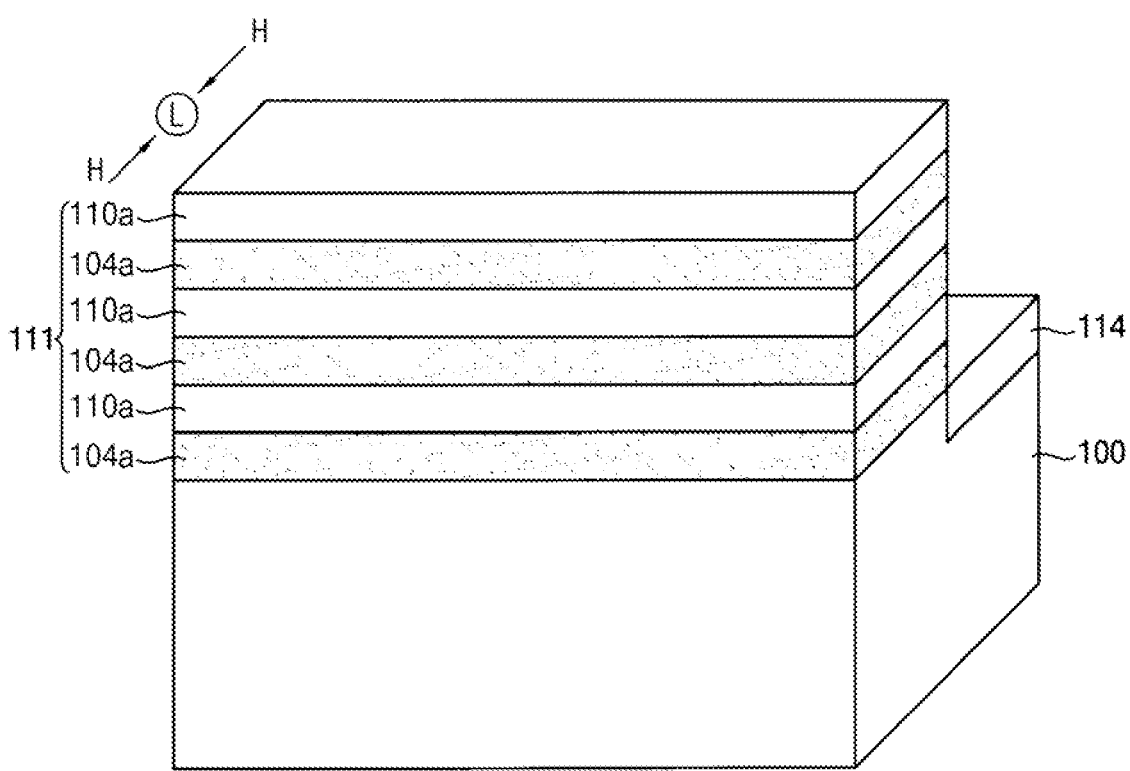

FIGS. 20 and 21 are a cross-sectional view and a perspective view of a semiconductor device in accordance with example embodiments. FIGS. 22 and 23 are perspective views of concentrations of silicon in preliminary first semiconductor patterns in each of active structures.

The semiconductor device may be the same as or similar to the semiconductor device illustrated with reference to FIGS. 1A, 1B, and 3, except that the first opening and the third semiconductor layer may not be formed.

Referring to FIGS. 20 and 21, the semiconductor device may include the preliminary active structure 111, the gate structure 146, and the insulation layer 136 formed on the substrate 100. The semiconductor device may further include the isolation pattern 114 and the spacer 130. The semiconductor device may include a fin field effect transistor formed on the preliminary active structure 111.

The preliminary active structure 111 may include preliminary first semiconductor patterns 104a and preliminary second semiconductor patterns 110a alternately and repeatedly stacked. The preliminary active structure 111 may have a line shape extending in the first direction. A plurality of preliminary active structures 111 may be spaced apart from each other in the second direction.

In an implementation, the preliminary first semiconductor pattern 104a may be a silicon germanium pattern doped with silicon. Thus, the preliminary first semiconductor pattern 104a may be a silicon rich-silicon germanium pattern. In an implementation, a concentration of silicon in the preliminary first semiconductor pattern 104a may be about 70% or more. In an implementation, in the preliminary first semiconductor pattern 104a, the concentration of silicon may be in range of about 70% to about 85%, and the concentration of germanium may be in range of about 15% to about 30%. In an implementation, the preliminary second semiconductor pattern 110a may be a silicon pattern.

In an implementation, the concentration of silicon may vary depending on positions in the vertical direction of the preliminary first semiconductor patterns 104a of the preliminary active structure 111 or inner positions within in each of the preliminary first semiconductor patterns 104a.

In an implementation, as shown in FIG. 22, in the preliminary active structure 111, the concentration of the silicon in the preliminary first semiconductor patterns 104a may be gradually decreased downwardly in the vertical direction toward the surface of the substrate 100.

In an implementation, as shown in FIG. 23, both sidewalls extending lengthwise in the first direction of each of the preliminary first semiconductor patterns 104a may have a highest concentration of silicon. Also, the concentration of silicon may be gradually decreased from the sidewalls extending in the first direction of each of the preliminary first semiconductor patterns 104b toward a center portion thereof (e.g., inwardly in the second direction).

The gate structure 146 may be on both sidewalls facing in the second direction and an upper surface of the preliminary active structure 111 and the substrate 100. The gate structure 146 may extend in the second direction. The spacer 130 may be on sidewalls of the gate structure 146.

A portion of the upper surface of the preliminary active structure 111 may be exposed by a gap between the gate structures 146 in the first direction. The preliminary active structure 111 between the gate structures 146 may serve as source/drain regions of a transistor. Thus, the preliminary active structure 111 between the gate structures 146 may be doped with impurities.

The insulation layer 136 may be on the substrate 100 and the preliminary active structure 111. The insulation layer 136 may fill the gap between the gate structures 146. An upper surface of the insulation layer 136 may be coplanar with an upper surface of the gate structure 146.

A method for manufacturing the semiconductor device may be similar to that illustrated with reference to FIGS. 9 to 19 and FIGS. 1A, 1B, and 3, except that the first opening and the third semiconductor layer may not be formed.

Hereinafter, a method for manufacturing the semiconductor device may be briefly described.

First, processes illustrated with reference to FIGS. 9 to 14 may be performed to form the dummy gate structure 128. Thereafter, the spacer 130 may be formed on sidewalls of the dummy gate structure 128. The preliminary active structure 111 exposed by the gap between the dummy gate structures 128 may be further doped with impurities. Thus, the preliminary active structure 111 between the dummy gate structure 128 may serve as the source/drain regions.

Subsequently, the same processes as those illustrated with reference to FIGS. 18 and 19 and FIGS. 1A, 1B, and 3 may be performed to manufacture the semiconductor device shown in FIGS. 20 and 21.

As described above, when the silicon ions are implanted into the preliminary first semiconductor layer 102 in the vertical direction, each of the preliminary first semiconductor patterns 104a in the preliminary active structure 111 may have the concentration of silicon as illustrated with reference to FIG. 22.

In an implementation, the ion implantation process of silicon may be performed after forming the preliminary active structure 111 (refer to FIGS. 12 and 13).

In an implementation, the silicon ions may be implanted in a direction perpendicular to the upper surface of the preliminary active structure 111 (e.g., in the vertical direction). In this case, each of the preliminary first semiconductor patterns 104a may have the concentration of silicon as illustrated with reference to FIG. 22.

In an implementation, the silicon ions may be implanted in an inclined direction with respect to the upper surface of the preliminary active structure 111. In this case, each of preliminary first semiconductor patterns 104a may have the concentration of silicon as illustrated with reference to FIG. 23.

In an implementation, the ion implantation process of silicon may be performed after forming the second opening 138 (refer to FIGS. 18 and 19). In this case, each of preliminary first semiconductor patterns 104a may have the concentration of silicon as illustrated with reference to FIG. 23. Also, the silicon may not be implanted in the preliminary first semiconductor patterns 104a corresponding to the source/drain regions.

Figure 24:
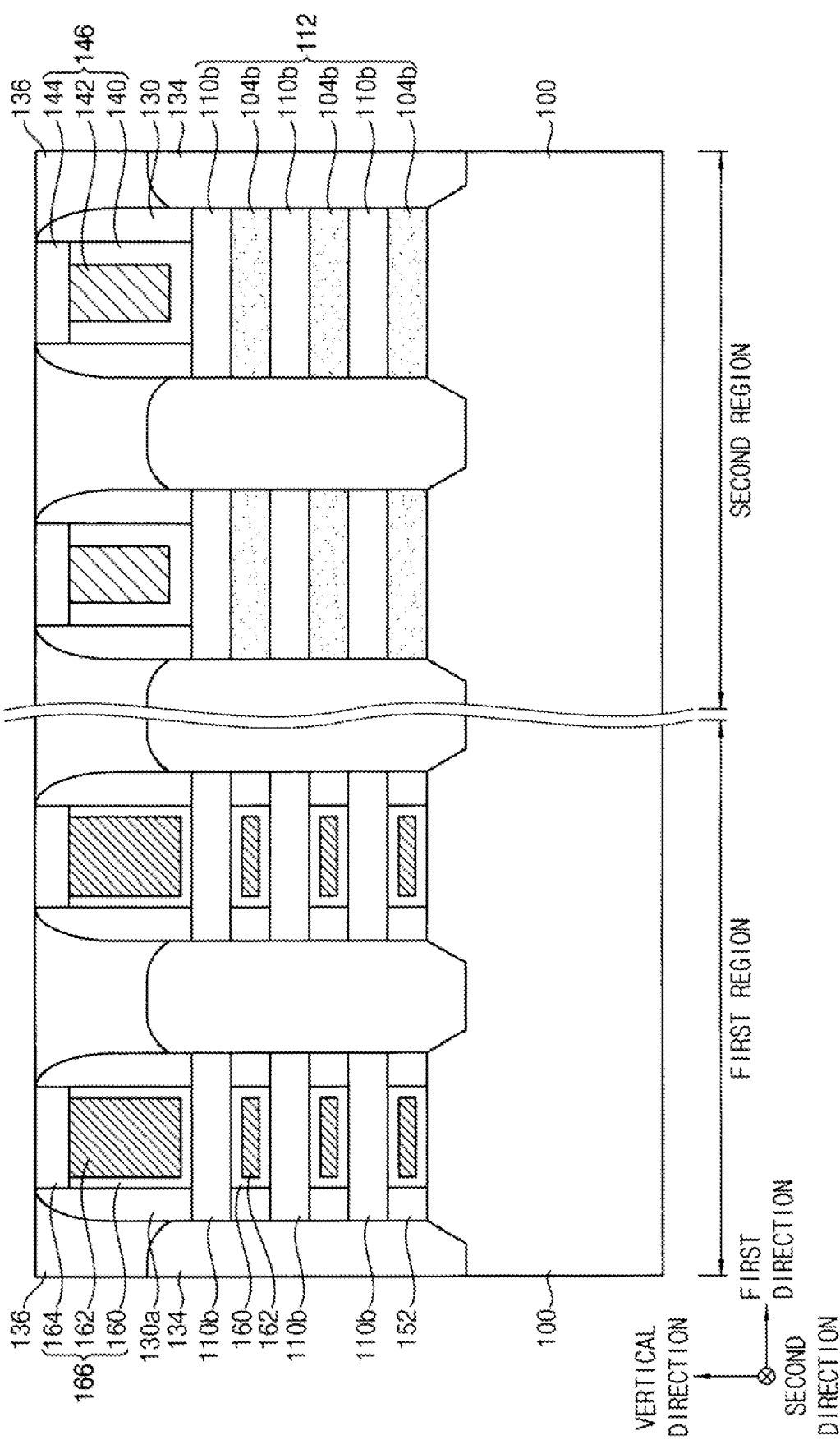
FIG. 24 illustrates a cross-sectional view of a semiconductor device in accordance with example embodiments.

FIG. 24 is a cross-sectional view illustrating a semiconductor device in accordance with example embodiments.

Referring to FIG. 24, the semiconductor device may include a multi-bridge channel transistor on a first region of a substrate and a fin field effect transistor on a second region of the substrate.

The fin field effect transistor on the second region may be substantially the same as that shown in FIGS. 1A, 1B to 3. In an implementation, the active structure 112, the gate structure 146, the third semiconductor layer 134, and the insulation layer 136 may be on the second region of the substrate. The gate structure 146 may include the gate insulation layer pattern 140, the gate pattern 142, and the hard mask 144. The semiconductor device may further include the isolation pattern 114 and the spacer 130. Repeated detailed descriptions of the fin field effect transistor in substrate 100 of the second region may be omitted.

The multi-bridge channel transistor in the substrate 100 of the first region may include a first active structure, a first gate structure 166, a third semiconductor layer 134, and a lower spacer 152. The transistor in the substrate 100 of the first region may further include the isolation pattern 114 and an upper spacer 130a.

The first active structure may include second semiconductor patterns 110b spaced apart from each other in the vertical direction. The first active structure may have a shape the same as a second active structure from which the first semiconductor patterns are removed. The second semiconductor patterns 110b being spaced apart in the vertical direction may serve as channel regions of the transistor, respectively.

The lower spacer 152 may be on upper and lower surfaces of edges in the first direction of the second semiconductor patterns 110b to support upper and lower surfaces of the second semiconductor patterns 110b. Thus, in the first active structure, a gap may be between the second semiconductor patterns 110b in the vertical direction. The gap may be defined by the upper and lower surfaces of the second semiconductor patterns 110b and lower spacers 152.

In an implementation, a height in the vertical direction of the gap may be substantially the same as a height in the vertical direction of the first semiconductor pattern 104b in the second active structure on the substrate 100 of the second region.

The first gate structure 166 may cover a front side and a backside of the first active structure in the second direction to fill the gap between the second semiconductor patterns 110b. Further, the first gate structure 166 may be formed on an upper surface of the first active structure.

The first gate structure 166 may include a first gate insulation layer pattern 160, a first gate pattern 162, and a first hard mask 164. The first gate insulation layer pattern 160 and the first gate pattern 162 may be formed to fill the gap. The first gate insulation layer pattern 160 may surround a surface of the first gate pattern 162 in the gap.

In an implementation, a thickness of the first gate insulation layer pattern 160 may be less than a thickness of the gate insulation layer pattern 140 on the second region of the substrate 100. In an implementation, the thickness of the first gate insulation layer pattern 160 may be less than ½ of a height in the vertical direction of the first semiconductor pattern 104b. In addition, the thickness of the first gate insulation layer pattern 160 may be less than ½ of a height in the vertical direction of the gap.

The first hard mask 164 may be on an uppermost portion of the first gate structure 166. The upper spacer 130a may be on sidewalls of the first gate structure 166 above the gap. The first hard mask 164 and the upper spacer 130a may have shapes the same as shapes of the hard mask 144 and the spacer 130 on the second region of the substrate 100, respectively. Further, the first hard mask 164 and the upper spacer 130a may include materials the same as materials of the hard mask 144 and the spacer 130 on the substrate 100 of the second region, respectively.

The third semiconductor layer 134 and the insulation layer 136 may be on the first region of the substrate 100. The third semiconductor layer 134 and the insulation layer 136 on the first region of the substrate 100 may have shapes the same as shapes of the third semiconductor layer 134 and the insulation layer 136 on the second region of the substrate, respectively. The third semiconductor layer 134 and the insulation layer 136 on the first region of the substrate 100 may include materials the same as materials of the third semiconductor layer 134 and the insulation layer 136 formed on the second region of the substrate, respectively.

As described above, the multi-bridge channel transistor may be on the first region of the substrate 100. Further, the fin field effect transistor may be on the second region of the substrate 100, and the fin field effect transistor may be on the active structure in which the first semiconductor patterns 104b and the second semiconductor patterns 110b are repeatedly stacked. The thickness of the gate insulation layer pattern 140 of the fin field effect transistor formed in the substrate 100 of the second region may be greater than the thickness of the first gate insulation layer pattern 160 of the multi-bridge transistor. Thus, an operating voltage of the fin field effect transistor may be higher than an operating voltage of the multi-bridge transistor. In an implementation, the fin field effect transistor may serve as an I/O device having a high operating voltage.

FIGS. 25 to 28 are cross-sectional views of stages in a method of manufacturing a semiconductor device in accordance with example embodiments.

Figure 25:
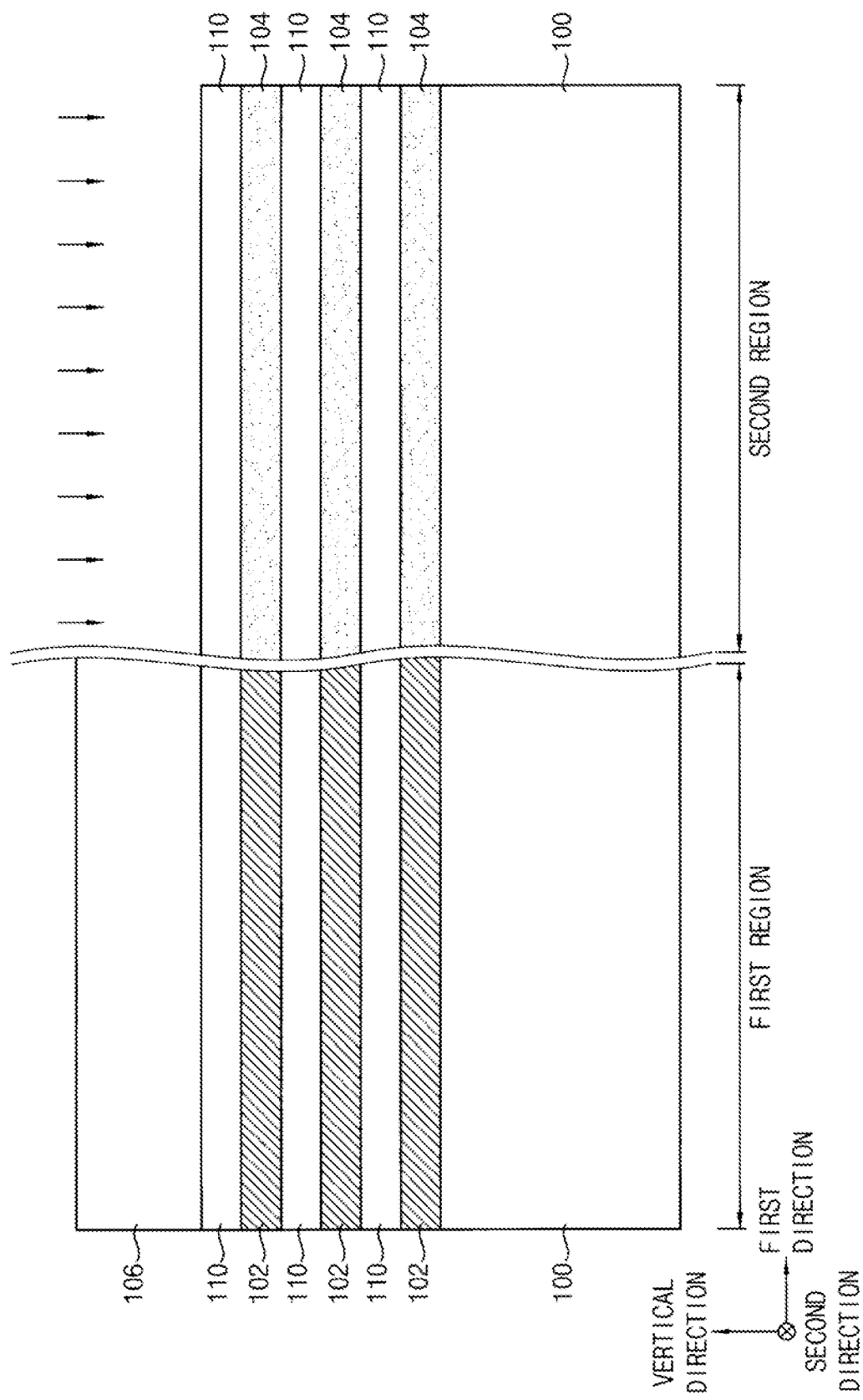
FIGS. 25 to 28 illustrate cross-sectional views of stages in a method of manufacturing a semiconductor device in accordance with example embodiments.

Referring to FIG. 25, preliminary first semiconductor layers 102 and second semiconductor layers 110 may be alternately and repeatedly stacked to form a stacked layer on the substrate 100 including the first region and the second region. In this case, an uppermost layer of the stacked layer may be the second semiconductor layer 110.

In an implementation, the second semiconductor layer 110 may include a silicon layer, and the preliminary first semiconductor layer 102 may include a silicon-germanium layer. In an implementation, the preliminary first semiconductor layer 102 may have a silicon concentration of about 67% to 70% and a germanium concentration of about 30% to 33%.

An ion implantation mask 106 may be formed on an uppermost second semiconductor layer 110 to cover the uppermost second semiconductor layer 110 of the first region. Thus, an uppermost the second semiconductor layer 110 of the second region may be exposed. The ion implantation mask 106 may include, e.g., a photoresist pattern.

Silicon ions may be implanted into the stacked layer of the second region using the ion implantation mask 106. The silicon ions may be implanted in a direction perpendicular to an upper surface of the preliminary first semiconductor layer 102 (e.g., the vertical direction). When the ion implantation process is performed, a concentration of silicon in the preliminary first semiconductor layer 102 of the second region may be increased to form the first semiconductor layer 104. In an implementation, the first semiconductor layer 104 may be formed of a silicon rich-silicon germanium layer having a concentration of silicon higher than the concentration of silicon in the preliminary first semiconductor layer 102. In an implementation, the concentration of silicon in the first semiconductor layer 104 may be 70% or more. In an implementation, the first semiconductor layer 104 may have a silicon concentration of about 70% to 80% and a germanium concentration of about 15% to about 30%.

Meanwhile, the preliminary first semiconductor layer 102 including the silicon germanium without an implantation of the silicon ion may remain in the first region. The preliminary first semiconductor layer 102 may serve as a sacrificial layer.

As described above, the ion implantation process of silicon may be performed at another stage at which the preliminary active structure is exposed. In an implementation, before performing the ion implantation process of silicon, a process for forming an ion implantation mask to cover structures formed on the substrate of the first region may be further performed.

Subsequently, the processes illustrated with reference to FIGS. 12 to 16 may be performed on structures formed on the substrate 100 of the first and second regions. Thus, the first openings 132 (refer to FIG. 26) may be formed on the first and second regions of the substrate 100, respectively. By the processes, a preliminary sacrificial pattern including silicon germanium without an implantation of the silicon ion may be formed on the first region of the substrate 100.

Figure 26:
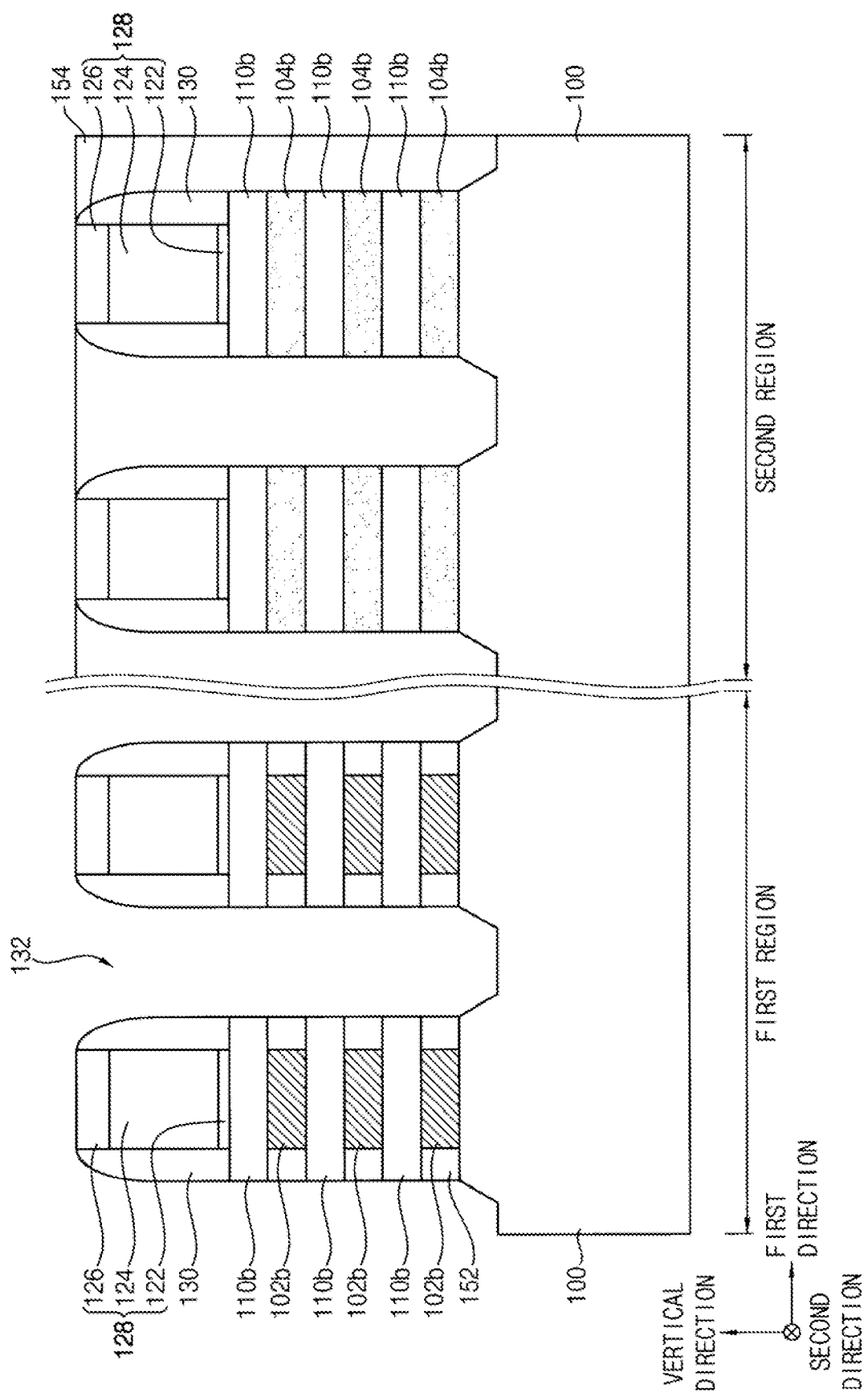

Referring to FIG. 26, a first blocking pattern 154 may be formed to cover a structure on the second region of the substrate 100, so that only the first region of the substrate 100 is exposed.

In the first region of the substrate, both sidewalls of the preliminary sacrificial pattern exposed by the first opening 132 may be partially etched to form a first recess. The preliminary sacrificial pattern may be formed as a sacrificial pattern 102b by the etching process. A width in the first direction of the sacrificial pattern 102b may be less than a width in the first direction of the second semiconductor pattern 110b.

Thereafter, a lower spacer 152 may be formed in the first recess. The lower spacer 152 may include, e.g., silicon nitride.

Figure 27:
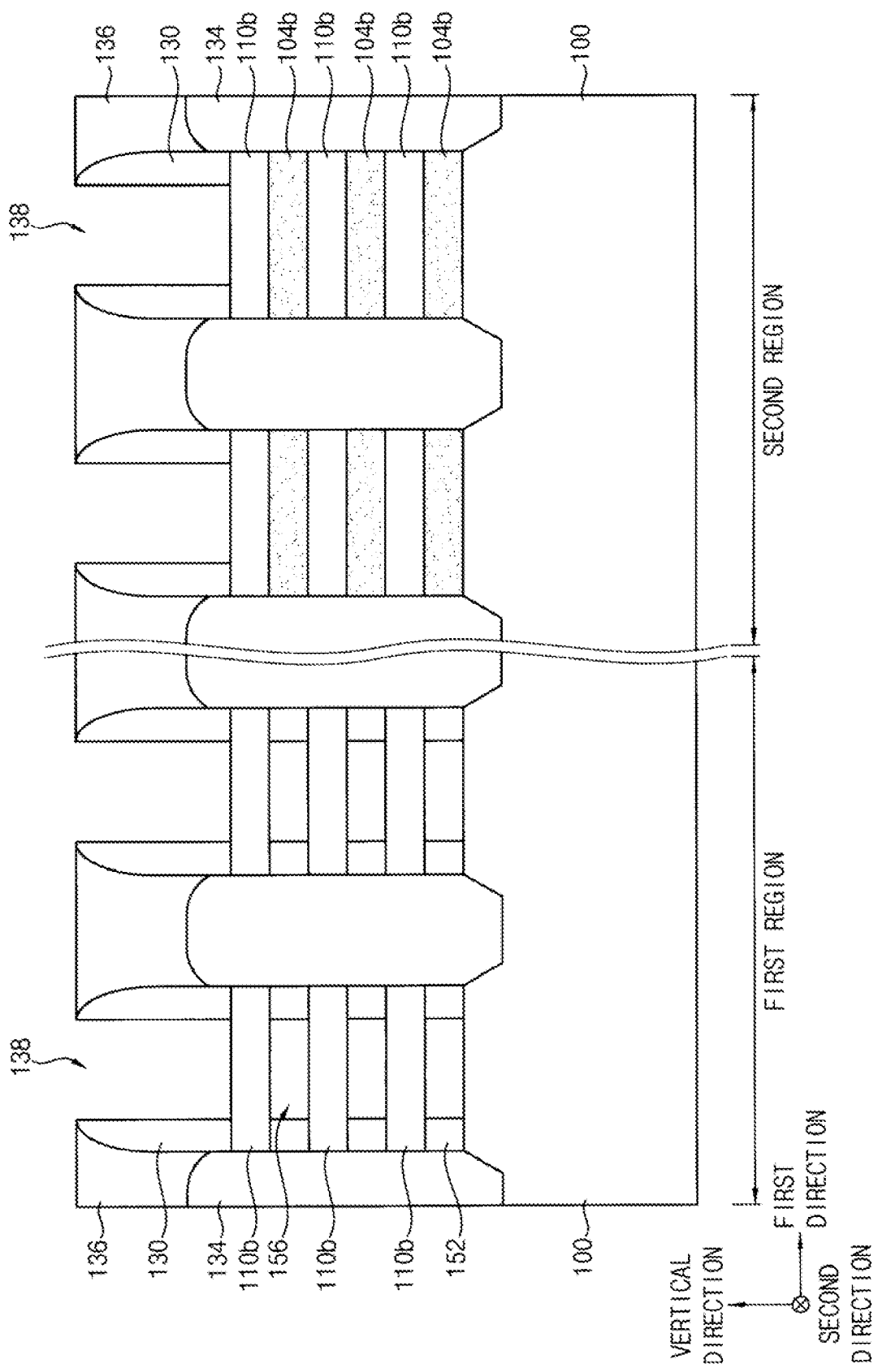

Referring to FIG. 27, the first blocking pattern 154 may be removed. In addition, the processes illustrated with reference to FIGS. 17 and 18 may be performed on structures formed on the first and second regions of the substrate 100.

Thus, the dummy gate structure formed on the first and second regions of the substrate 100 may be removed to form the second opening 138.

On the first region, both sidewalls in the second direction of a structure including the sacrificial patterns 102b and the second semiconductor patterns 110b alternately stacked may be exposed by the second opening 138. On the second region, sidewalls in the second direction of the active structure 112 may be exposed by the second opening 138.

A second blocking pattern may be formed to cover the structure formed on the second region of the substrate 100. Thereafter, on the first region, the sacrificial pattern 102b exposed by the second opening 138 may be selectively removed to form a gap 156. The gap 156 may be in communication with the second opening 138. Thus, the gap 156 and the second opening 138 may be merged to extend in the second direction.

Figure 28:
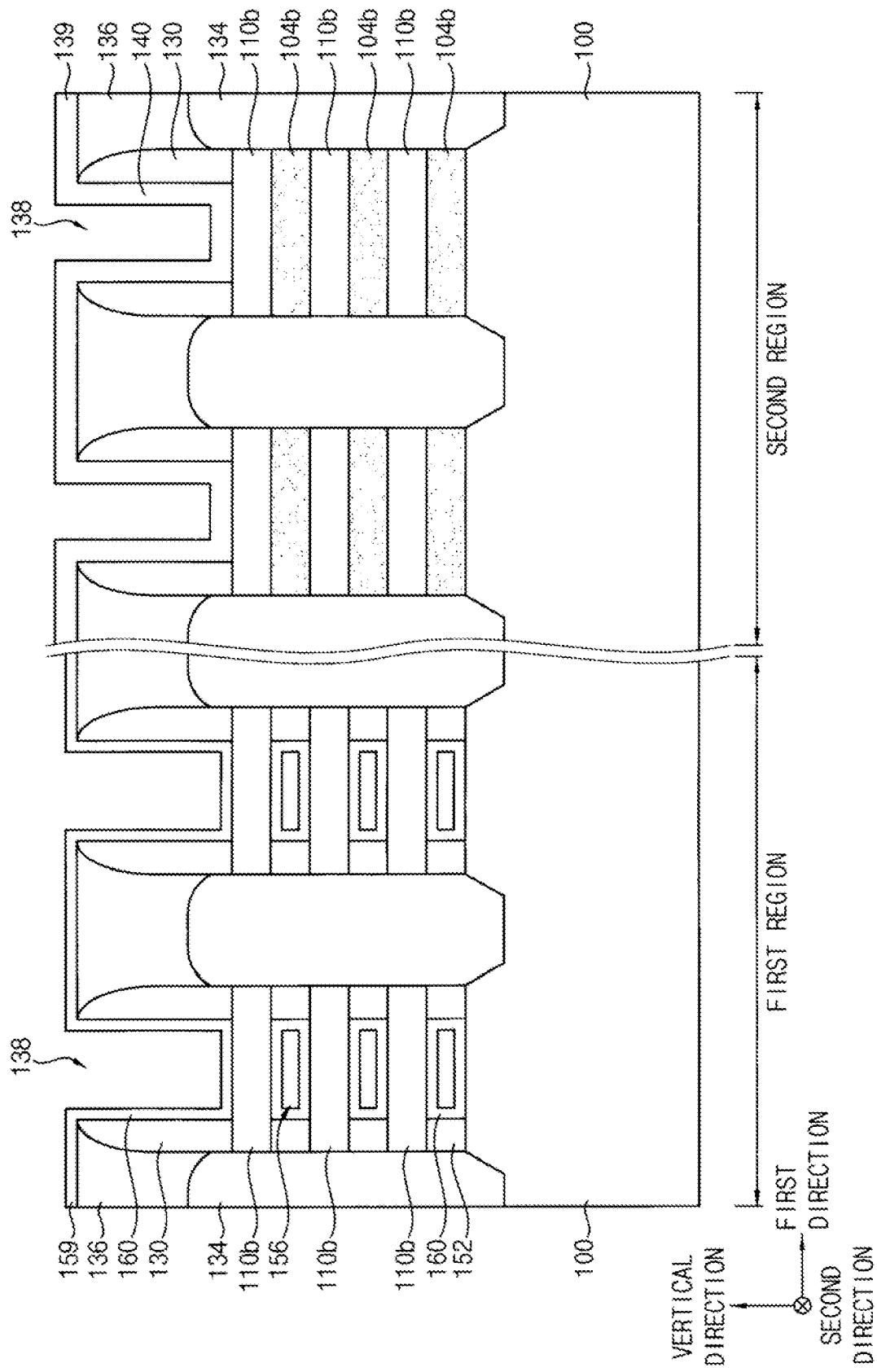

Referring to FIGS. 28 and 24, a first gate structure 166 may be formed on the first region of the substrate 100 to fill the second opening 138 and the gap 156. Further, a gate structure 146 may be formed on the second region of the substrate 100 to fill the second opening 138.

In an implementation, on the first region, a first gate insulation layer 159 having a first thickness may be conformally formed on the substrate 100, the second semiconductor pattern 110b and inner walls of the upper and lower spacers 130a and 152 exposed by the second opening 138 and the gap 156.

On the second region, a gate insulation layer 139 having a second thickness greater than the first thickness may be formed on the surface of the active structure 112 exposed by the second opening 138.

Thereafter, a gate electrode layer may be formed on the first gate insulation layer 159 and the gate insulation layer 139 to fill the gap 156 and the second opening 138. In an implementation, a work function control layer may be further formed before forming the gate electrode layer.

Thereafter, the gate electrode layer, the work function control layer, the gate insulation layer, and the first gate insulation layer may be planarized until an upper surface of the insulation layer 136 are exposed. In addition, the gate insulation layer, the first gate insulation layer, and the gate electrode layer may be partially etched to form a recess, and then a hard mask may be formed in the recess.

Thus, the first gate structure may be formed on the first region of the substrate, and the gate structure may be formed on the second region of the substrate. The first gate structure 166 may include a first gate insulation layer pattern 160, a first gate pattern 162, and a first hard mask 164. The gate structure 146 may include a gate insulation layer pattern 140, a gate pattern 142, and a hard mask 144.

Figure 29:
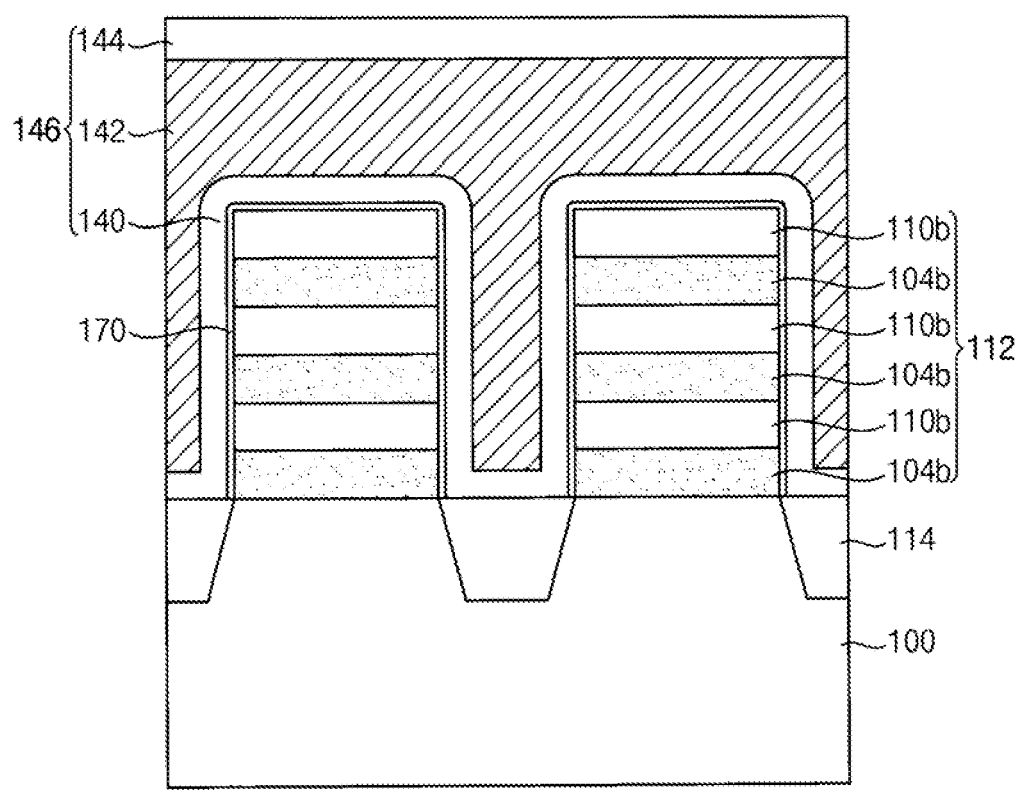
FIG. 29 illustrates a cross-sectional view of a semiconductor device in accordance with example embodiments.

FIG. 29 is a cross-sectional view of a semiconductor device in accordance with example embodiments.

FIG. 29 shows a cross-sectional view of an active structure cut in the second direction.

The semiconductor device may be the same as or similar to the semiconductor device illustrated with reference to FIGS. 1A, 1B, and 3, except that a capping semiconductor pattern may be further formed on sidewalls in the second direction of the active structure.

Referring to FIG. 29, the semiconductor device may include the active structure 112, the gate structure 146, the insulation layer 136, and the capping semiconductor pattern 170 on the substrate 100. The semiconductor device may further include the isolation pattern 114 and the spacer 130.

As illustrated with reference to FIGS. 1A, 1B, and 3, the active structure 112 may include the first semiconductor patterns 104b and the second semiconductor patterns 110b alternately and repeatedly stacked, and the first semiconductor pattern 104b and a second semiconductor pattern 110b may include different semiconductor materials to each other. In an implementation, the active structure 112 may include silicon germanium patterns 104b doped with silicon and silicon pattern 110bs alternately stacked.

The capping semiconductor pattern 170 may be on the sidewalls of the active structure 112 that face in the second direction. The capping semiconductor pattern 170 may cover at least sidewalls of the active structure 112 that face in the second direction.

In an implementation, the capping semiconductor pattern 170 may include a material substantially the same as that of the second semiconductor pattern 110b. The capping semiconductor pattern 170 may include silicon. In an implementation, the capping semiconductor pattern 170 may include single crystal silicon. In an implementation, the capping semiconductor pattern 170 may include polysilicon.

In an implementation, the capping semiconductor pattern 170 may be formed on the sidewalls facing in the second direction of the active structure 112 and on an upper surface of the active structure 112. In an implementation, the capping semiconductor pattern 170 may include the material substantially the same as a material of an uppermost second semiconductor pattern 110b, so that the capping semiconductor pattern 170 on an upper surface of the active structure 112 and the second semiconductor pattern 110b thereunder may not be distinguished from each other (e.g., without a distinct interface therebetween).

In an implementation, the capping semiconductor pattern 170 may be on only the sidewalls of the active structure 112 that face in the second direction to have a spacer shape.

As the capping semiconductor pattern 170 is formed, the gate insulation layer pattern 140 included in the gate structure 146 may conformally formed to cover the surface of the capping semiconductor pattern 170 and the upper surface of the active structure 112. Further, the gate insulation layer pattern 140 may be formed on an inner sidewall of the spacer 130. In an implementation, the capping semiconductor pattern 170 may be formed between the active structure 112 and the gate structure 146.

As described above, the capping semiconductor pattern 170 may be formed on the sidewall of the active structure 112 that faces in the second direction, so that the on currents of the fin field effect transistor may be increased.

Figure 30:
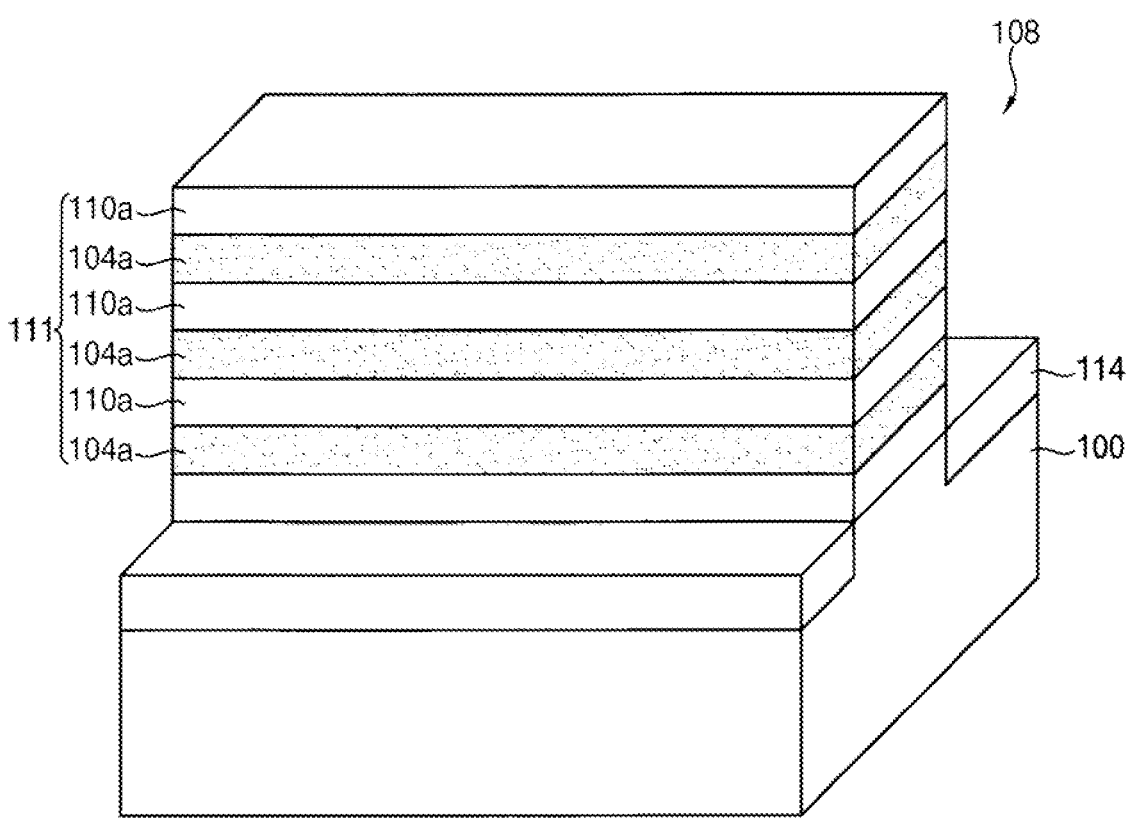
FIGS. 30 and 31 illustrate perspective views of stages in a method of manufacturing a semiconductor device in accordance with example embodiments.
Figure 31:
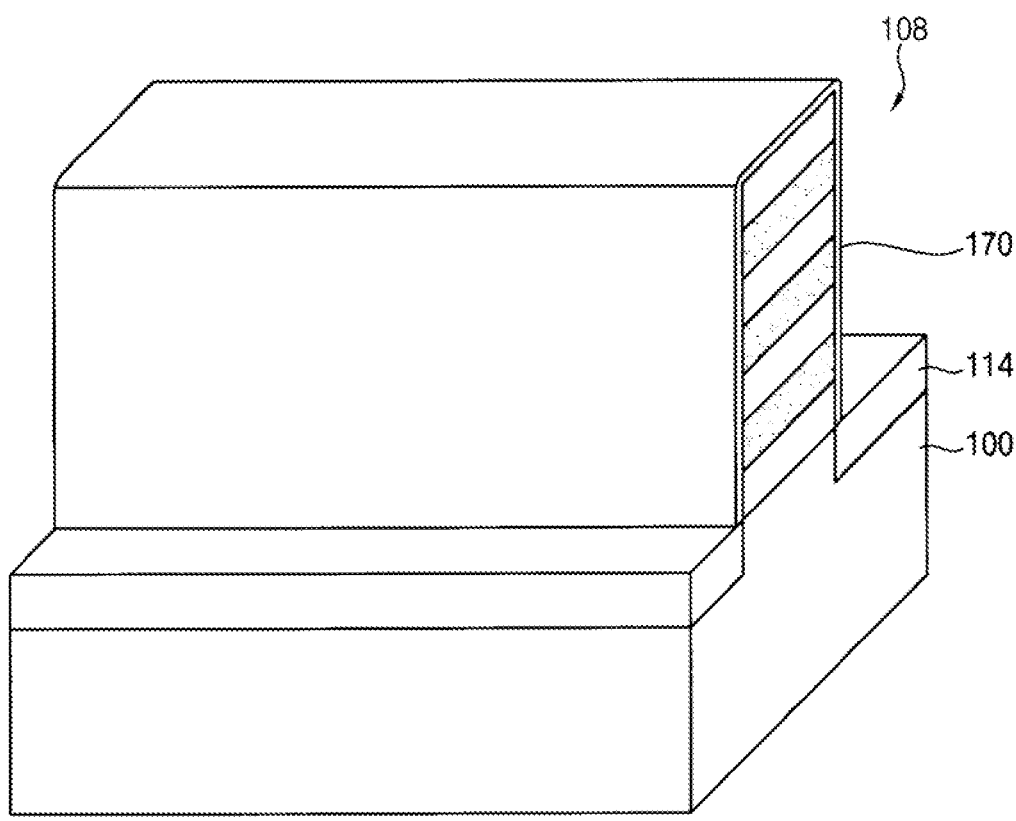

FIGS. 30 and 31 are perspective views of stages in a method of manufacturing a semiconductor device in accordance with example embodiments.

First, the processes illustrated with reference to FIGS. 9 to 13 may be performed to form the preliminary active structure 111 as shown in FIG. 30.

Referring to FIG. 31, a capping semiconductor pattern 170 may be formed to cover at least sidewalls of the preliminary active structure 111.

In an implementation, the capping semiconductor pattern 170 may be formed to grow silicon by performing a selective epitaxial growth (SEG) process. When the selective epitaxial growth process is performed, the capping semiconductor pattern 170 including silicon may be formed on the sidewalls and the upper surface of the preliminary active structure 111.

In an implementation, a silicon layer may be conformally formed on the sidewalls and upper surfaces of the preliminary active structure 111 and the isolation pattern 114, and then the silicon layer may be anisotropically etched to form the capping semiconductor pattern 170. In this case, the capping semiconductor pattern 170 may be formed on the sidewalls of the preliminary active structure 111 to have the spacer shape. The silicon layer may include polysilicon.

Subsequently, the same processes as illustrated with reference to FIGS. 14 to 19 and FIGS. 1A and 1B to 3 may be performed to manufacture the semiconductor device shown in FIG. 29.

Figure 32:
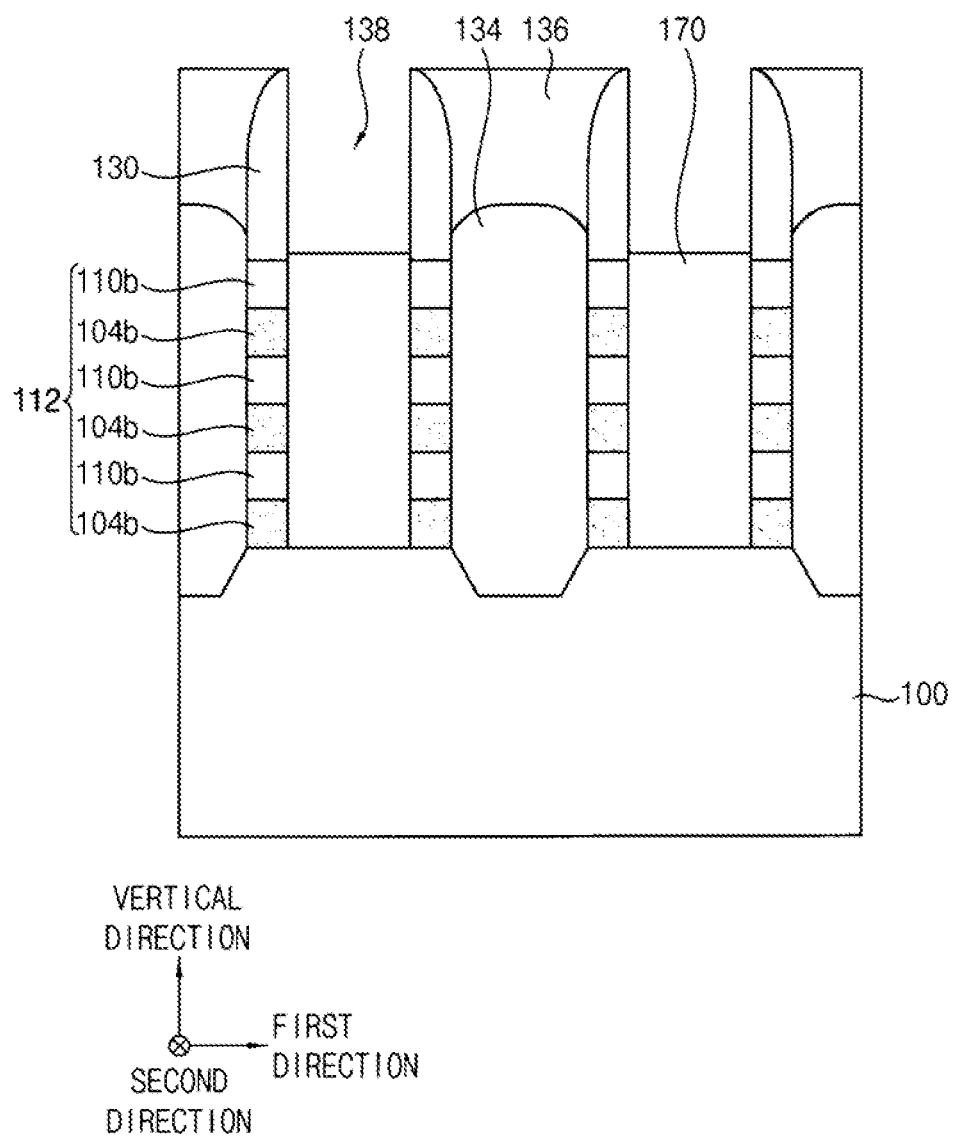
FIGS. 32 and 33 illustrate a cross-sectional view and a perspective view of stages in a method of manufacturing a semiconductor device in accordance with example embodiments.
Figure 33:
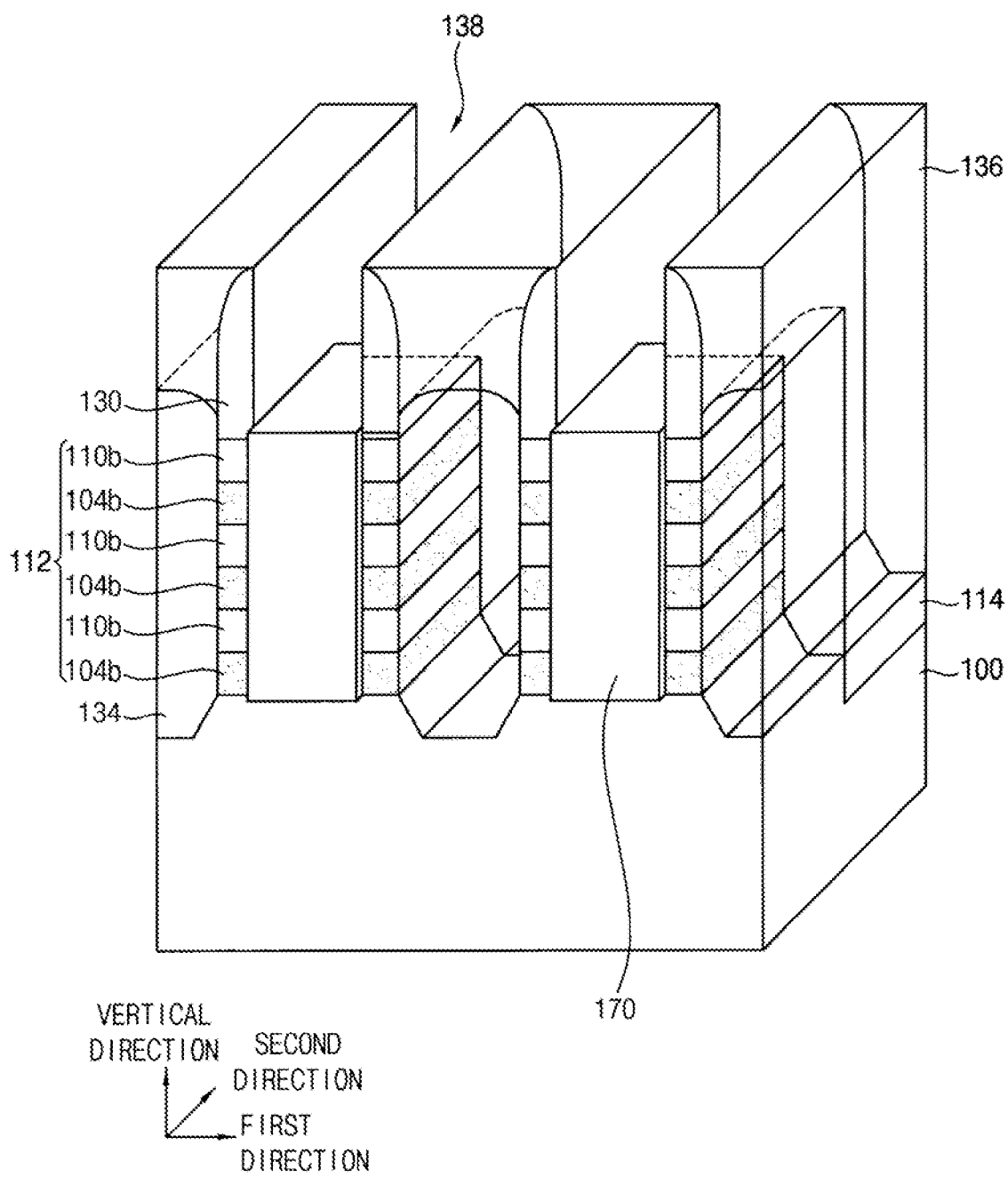

FIGS. 32 and 33 are a cross-sectional view and a perspective view of stages in a method of manufacturing a semiconductor device in accordance with example embodiments.

The method of manufacturing the semiconductor device may be the same as the method illustrated with reference to FIGS. 30 and 31, except for steps of forming the capping semiconductor pattern.

First, the processes illustrated with reference to FIGS. 9 to 19 may be performed to form the second opening exposing the sidewalls in the second direction of the active structure 112, as shown in FIG. 19.

Referring to FIGS. 32 and 33, the capping semiconductor pattern 170 may be formed on the sidewalls and the upper surface of the active structure 112 exposed by the second opening.

In an implementation, the capping semiconductor pattern 170 may be formed as growth silicon by performing a selective epitaxial growth (SEG) process. When the selective epitaxial growth process is performed, the capping semiconductor pattern 170 including silicon may be formed on the sidewalls and the upper surface of the active structure 112.

In this case, the capping semiconductor pattern 170 may not be formed on the sidewalls of the active structure 112 positioned directly below the spacer 130.

Subsequently, the same processes as illustrated with reference to FIGS. 1A, 1B, and 3 may be performed to form the semiconductor device shown in FIG. 29.

By way of summation and review, in the fin field effect transistor, electrons may only move at a limited region included in the active fin structure, and thus on currents (e.g., on-state currents) of the fin field effect transistor may be decreased.

One or more embodiments may provide semiconductor devices having active fin structures.

One or more embodiments may provide a semiconductor device having good characteristics.

The semiconductor device in accordance with example embodiments may include the active fin structure in which the silicon patterns and the silicon germanium patterns are repeatedly and alternately stacked. The silicon germanium pattern may include the silicon rich-silicon germanium (e.g., doped with silicon). In an implementation, a concentration of silicon in the silicon germanium pattern may be increased, so that a potential barrier between the silicon pattern and the silicon germanium pattern may be decreased. Thus, a potential well may be lowered or a slope of the potential well may be gentle. Therefore, regions in which electrons are moved in the active fin structure may be increased, so that on currents of a transistor may be increased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method for manufacturing a semiconductor device, the method comprising:
    alternately and repeatedly stacking a silicon germanium layer and a silicon layer on a substrate in a vertical direction perpendicular to a surface of the substrate to form a stacked structure;
    forming silicon-rich silicon germanium layers from the silicon germanium layer by ion implanting silicon on the stacked structure;
    patterning the stacked structure to form a preliminary active structure extending in a first direction parallel to the surface of the substrate;
    patterning the preliminary active structure to form an active structure including silicon germanium patterns and silicon patterns that are alternately and repeatedly stacked in the vertical direction;
    forming a semiconductor layer formed on both sidewalls of the active structure and serving as a source/drain region; and,
    forming a gate structure on a surface of the active structure and on the substrate, the gate structure extending in a second direction parallel to the substrate surface and perpendicular to the first direction.

2. The method of claim 1, wherein concentrations of silicon contained in the silicon-rich germanium layers are different from each other, and the concentration of silicon depends on positions of the silicon-rich germanium layers disposed in the vertical direction in the stacked structure, after ion implanting silicon.

3. The method of claim 2, wherein the concentrations of silicon contained in the silicon-rich germanium layers decrease from top portion toward the bottom of the stacked structure, after ion implanting silicon.

4. The method of claim 1, further comprising ion implanting silicon, after forming the preliminary active structure.

5. The method of claim 4, wherein in the ion implanting silicon after forming the preliminary active structure, the silicon is implanted in a direction perpendicular to an upper surface of the preliminary active structure or in a direction inclined to the upper surface of the preliminary active structure.

6. The method of claim 5, wherein:
    the silicon is implanted in the direction inclined to the upper surface of the preliminary active structure after forming the preliminary active structure, and
    a concentration of silicon decreases from the sidewalls facing in the first direction toward a center portion of each of the silicon-rich germanium layers.

7. The method of claim 1, further comprising ion implanting silicon, after forming the active structure.

8. The method of claim 7, wherein in the ion implanting silicon after forming the active structure, the silicon is implanted in a direction perpendicular to an upper surface of the active structure or in a direction inclined to the upper surface of the active structure.

9. The method of claim 1, wherein forming the preliminary active structure further includes:
   forming a dummy gate structure extending in the second direction; and
   forming a spacer on a sidewall of the dummy gate structure.

10. The method of claim 9, wherein the active structure is patterned using the dummy gate structure as an etch mask to form the active structure.

11. The method of claim 9, further comprising removing the dummy gate structure before forming the gate structure,
   wherein the gate structure is formed in a portion where the dummy gate structure is removed.

12. The method of claim 1, wherein the alternating and repeated stacking of the silicon germanium layer and the silicon layer includes performing an epitaxial growth process.

13. The method of claim 1, wherein:
   the gate structure is on an upper surface and both sidewalls facing in the second direction of the active structure, and
   the gate structure includes a gate insulation layer pattern, a gate pattern, and a hard mask.

14. The method of claim 13, wherein a thickness of the gate insulation layer pattern is greater than ½ of a height in the vertical direction of one of the silicon germanium patterns.

15. A method for manufacturing a semiconductor device, the method comprising:
   alternately and repeatedly stacking a silicon germanium layer and a silicon layer on a substrate in a vertical direction perpendicular to a surface of the substrate to form a stacked structure;
   patterning the stacked structure to form a preliminary active structure extending in a first direction parallel to the surface of the substrate;
   patterning the preliminary active structure to form an active structure including silicon germanium patterns and silicon patterns that are alternately and repeatedly stacked in the vertical direction;
   forming a semiconductor layer formed on both sidewalls of the active structure and serving as a source/drain region; and
   forming a gate structure on a surface of the active structure and on the substrate, the gate structure extending in a second direction parallel to the substrate surface and perpendicular to the first direction,
   wherein:
   the method further includes ion implanting silicon after forming the stacked structure, after forming the preliminary active structure, or after forming the active structure, and
   a silicon concentration of the silicon germanium patterns is 70% to 85%.

16. The method of claim 15, wherein in the ion implanting silicon, the silicon is implanted in the vertical direction or in a direction inclined with respect to the vertical direction.

17. The method of claim 15, wherein:
   the gate structure is on an upper surface and both sidewalls facing in the second direction of the active structure, and the gate structure includes a gate insulation layer pattern, a gate pattern, and a hard mask, and
   a thickness of the gate insulation layer pattern is greater than ½ of a height in the vertical direction of one of silicon germanium patterns.

18. A method for manufacturing a semiconductor device, the method comprising:
   forming a first active structure on a first region of a substrate, the first active structure including silicon patterns spaced apart from each other in a vertical direction perpendicular to a surface of the substrate;
   forming a first gate structure on the substrate and the first active structure and filling a gap between the silicon patterns of the first active structure in the vertical direction;
   forming a second active structure on a second region of the substrate, the second active structure including silicon germanium patterns and silicon patterns alternately and repeatedly stacked in the vertical direction; and
   forming a second gate structure on a surface of the second active structure and the substrate,
   wherein the silicon germanium patterns in the second active structure are silicon rich-silicon germanium doped with silicon.

19. The method of claim 18, wherein:
   the first gate structure includes a first gate insulation layer pattern, a first gate pattern, and a hard mask,
   the second gate structure includes a second gate insulation layer pattern, a second gate pattern, and a hard mask, and
   a thickness of the second gate insulation layer pattern is greater than a thickness of the first gate insulation layer pattern.

20. The method of claim 19, wherein:
   a thickness of the first gate insulation layer pattern is less than ½ of a height in the vertical direction of one of the silicon germanium patterns, and
   a thickness of the second gate insulation layer pattern is greater than ½ of the height in the vertical direction of one of the silicon germanium patterns.

* * * * *